(12) United States Patent
Takeoka et al.

(10) Patent No.: US 7,171,600 B2
(45) Date of Patent: Jan. 30, 2007

(54) SEMICONDUCTOR WIRING SUBSTRATE, SEMICONDUCTOR DEVICE, METHOD FOR TESTING SEMICONDUCTOR DEVICE, AND METHOD FOR MOUNTING SEMICONDUCTOR DEVICE

(75) Inventors: Sadami Takeoka, Osaka (JP); Mitsuyasu Ohta, Osaka (JP); Osamu Ichikawa, Osaka (JP); Masayoshi Yoshimura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 294 days.

(21) Appl. No.: 10/828,263

(22) Filed: Apr. 21, 2004

(65) Prior Publication Data

US 2004/0199840 A1  Oct. 7, 2004

Related U.S. Application Data

(62) Division of application No. 10/187,269, filed on Jul. 2, 2002, now Pat. No. 6,734,549.

(30) Foreign Application Priority Data

Jul. 3, 2001  (JP) .............................. 2001-201950

(51) Int. Cl.
*G01R 31/28* (2006.01)
(52) U.S. Cl. .................................................. 714/727

(58) Field of Classification Search ................ 714/724, 714/726, 727, 729, 732, 738
See application file for complete search history.

(56) References Cited

U.S. PATENT DOCUMENTS

| | | | |
|---|---|---|---|
| 5,321,277 A * | 6/1994 | Sparks et al. ................. 257/48 |
| 6,400,173 B1 | 6/2002 | Shimizu et al. |
| 6,519,728 B2 | 2/2003 | Tsujii et al. |
| 6,715,105 B1 * | 3/2004 | Rearick ....................... 714/30 |
| 6,812,718 B1 * | 11/2004 | Chong et al. ............... 324/754 |
| 2002/0171449 A1 | 11/2002 | Shimizu et al. |
| 2002/0194584 A1 | 12/2002 | Tsujii et al. |
| 2003/0006795 A1 | 1/2003 | Asayama et al. |
| 2003/0032263 A1 | 2/2003 | Nagao et al. |

* cited by examiner

Primary Examiner—James C Kerveros
(74) Attorney, Agent, or Firm—McDermott Will & Emery LLP

(57) ABSTRACT

An apparatus for testing a semiconductor device by mounting a plurality of chip intellectual properties (IPs) on a common semiconductor wiring substrate, including a silicon wiring substrate on which the chip IPs are mounted. A circuit for a boundary scan test is formed on the silicon wiring substrate by connecting flip-flops to wiring, which are arranged to test connections in the wiring. An IP on Super-Sub (IPOS) device or each chip IP may be arranged to facilitate a scan test, a built-in self-test (BIST), etc., on the internal circuit of the chip IP.

4 Claims, 25 Drawing Sheets

SEMICONDUCTOR WIRING SUBSTRATE, SEMICONDUCTOR DEVICE, METHOD FOR TESTING SEMICONDUCTOR DEVICE, AND METHOD FOR MOUNTING SEMICONDUCTOR DEVICE

This application is a divisional of application Ser. No. 10/187,269 filed Jul. 2, 2002 now U.S. Pat. No. 6,734,549.

BACKGROUND OF THE INVENTION

The concept "system LSI" of a plurality of large-scale integrated circuits (LSIs) on a common substrate has recently been brought in and various methods of designing system LSIs have also been proposed. System LSIs in particular have the advantage of being realized as a wide variety of multifunctional semiconductor devices on an extremely large scale of integration in such a manner that a memory such as a dynamic random access memory (DRAM), a logic LSI, an analog circuit such as a high-frequency circuit, etc., are mounted in one semiconductor device.

As a method for testing each of such LSIs to determine whether the LSI is correctly formed, a built-in self-test (BIST), a scan test and a boundary scan test, for example, are known.

FIG. 24 is a block diagram for explaining a conventional ordinary built-in self-test (BIST). As shown in FIG. 24, a pattern generator for generating a test pattern, a result compressor and a control circuit are provided as BIST means in an LSI. The control circuit makes the test pattern generator generate a test pattern in response to a start signal and input the generated test pattern to a logic circuit which is a test object (DUT), and make the result compressor obtain a testing signal output from the test object and output the testing signal out of the LSI. An external instrument (tester) determines whether the test object logic circuit is operating normally. According to this testing method, a test can be automatically made without generating a pattern in a tester. This method has the advantage of using a smaller number of pins and imposing only an extremely small load on the tester.

FIG. 25 is a block diagram schematically showing an ordinary boundary scan test circuit. As shown in FIG. 25, the boundary scan test circuit has a scan chain formed by successively connecting flip flops (FFs) attached to external terminals of an LSI from an input test terminal (TDI) to an output test terminal (TDO). A test pattern is input to the scan chain to enable use of the boundary scan test circuit for determination as to whether connections between one LSI-A and an adjacent LSI-B are correctly made.

FIG. 26 is a block diagram showing an example of a configuration of a scan chain used in an ordinary scan test. Ordinarily, in a scan-in method, a scan chain test pattern is externally supplied and data output from a test object is immediately output from the test chain. That is, in ordinary cases of scan tests of internal circuits, no test pattern generator and no result compressor exist in the configuration shown in FIG. 24. However, scan-in may be used as a means for realizing a BIST.

FIG. 27 is a block diagram showing an example of a configuration of a flip flop provided in a boundary test circuit or a scan chain for a scan test of internal circuits.

The above-described conventional system LSIs are confronted with problems described below in actually forming devices.

The first problem resides in difficulty in reducing the device manufacturing cost. This is due to a high cost of development of system LSIs and a limited manufacturing yield.

The second problem resides in a considerable increase in wiring delay. In general, the height of devices is reduced in accordance with a shrinkage rule. With the reduction in sectional area of pieces of wiring, the wiring delay determined by RC (R is a resistance, and C is a parasitic capacitance) is increased. That is, as regards the wiring delay, the disadvantage of a design by a finer rule prevails over the advantage of the same. As a means for solving this problem, a buffer may be provided in wiring. However, if a buffer is provided, another problem arises in that the area occupied by a device and the power consumption of the device are increased.

The third problem resides in difficulty in reducing noise. If the power supply voltage is reduced, the current is increased and it is difficult to limit the increase in noise level corresponding to the increase in current. The S/N ratio becomes lower in proportion to the third to sixth power of the shrinkage rate. Thus, an increase in noise cannot be avoided when a finer design rule is used. That is, the point is how the power supply impedance is limited.

It is conceivable that a semiconductor device suitable for reduced-variety mass production is realized by mounting chip intellectual properties (IP) which are formed as integrated circuits by a plurality of various devices on a semiconductor wiring substrate having a wiring layer, e.g., a silicon wiring substrate. The chip IPs can be used as a means for realizing a semiconductor device incorporating multiple kinds of semiconductor devices having multiple functions while maintaining a large wiring piece sectional area.

However, there are no established means for mounting such chip IPs on a wiring substrate and for inspecting LSIs in the chip IPs. As mentioned above, the BIST method, the scan test method and the boundary scan test are known as conventional test methods. However, in a case where one of these test methods is used for testing of an IP On Super-Sub (IPOS) device, it has the drawback of requiring a considerably long test time if each of LSIs in chip IPs is separately tested after mounting of the chip IPs, and the drawback of being incapable of determination of defective/nondefective condition of wiring since there are no devices for receiving a signal on the wiring substrate before the chip IPs are provided.

SUMMARY OF THE INVENTION

An object of the present invention is to provide a semiconductor device in which chip IPs capable of being used as design properties are mounted on a common semiconductor wiring substrate, and which is designed so that each components can be easily inspected, and a method for inspecting the components of the semiconductor device.

To achieve the above-described object, according to a first device of the present invention, there is provided a semiconductor device including a semiconductor wiring substrate having a semiconductor substrate and a plurality of pieces of wiring formed on the semiconductor substrate, a plurality of chip IPs to be connected to the plurality of pieces of wiring being mounted on the semiconductor wiring substrate, an insulating layer formed on the pieces of wiring, and a boundary scan test circuit formed by a plurality of semiconductor elements provided on the insulating layer of the semiconductor wiring substrate, the boundary scan test circuit having connection points respectively connected to the plurality of pieces of wiring.

The semiconductor wiring substrate can be checked before mounting of the chip IPs to determine whether there is a defect in the wiring layer in the semiconductor wiring substrate.

If the above-described boundary scan test circuit is constituted by, for example, thin-film transistors (TFTs), it can be formed in the uppermost layer of the semiconductor wiring substrate.

According to a second device of the present invention, there is provided a semiconductor device including a semiconductor wiring substrate having a semiconductor substrate and a plurality of pieces of wiring formed on the semiconductor substrate, a plurality of chip IPs to be connected to the plurality of pieces of wiring being mounted on the semiconductor wiring substrate, a boundary scan test circuit provided in each of regions where the chip IPs are to be mounted, the boundary scan test circuit being constituted by a plurality of semiconductor element each having as its active region a portion of the semiconductor substrate of the semiconductor wiring substrate, the boundary scan test circuit being respectively connected to the plurality of pieces of wiring.

In this arrangement, the boundary scan test circuit can be formed below the chip IP mount regions, so that the entire area can be reduced.

According to a third device of the present invention, there is provided a semiconductor device including a semiconductor wiring substrate having a semiconductor substrate and a plurality of pieces of wiring formed on the semiconductor substrate, a plurality of chip IPs to be connected to the plurality of pieces of wiring being mounted on the semiconductor wiring substrate, an insulating layer formed on the pieces of wiring, and testing pads for testing the chip IPs, the testing pads being formed in a grid pattern on the semiconductor wiring substrate and individually connected to the plurality of pieces of wiring.

After mounting of the chip IPs on the semiconductor wiring substrate, each chip IP can be separately tested.

If the testing pads are formed in a grid pattern over the entire surface of the semiconductor wiring substrate, the semiconductor wiring substrate of the semiconductor device can adapted to chip IPs of any size.

According to a fourth device of the present invention, there is provided a semiconductor device including a semiconductor wiring substrate having a semiconductor substrate and a plurality of pieces of wiring formed on the semiconductor substrate, a plurality of chip IPs to be connected to the plurality of pieces of wiring being mounted on the semiconductor wiring substrate, and testing pads for testing the chip IPs, the testing pads being formed on the semiconductor wiring substrate and individually connected to the plurality of pieces of wiring. The above-described testing pads function as power supply pads only at the time of testing.

At the time of testing without consideration of power consumption, there is a possibility of all the chip IPs on the IPOS device operating at a time. Since the power consumption during ordinary operation is set to a smaller value, there is a risk of a malfunction resulting from lack of power when all the chip IPs in the IPOS device are operated for testing. In the arrangement of the present invention, additional power is supplied only at the time of testing to avoid lack of power.

According to a fifth device of the present invention, there is provided semiconductor device having a semiconductor substrate on which a plurality of chip IPs are to be mounted, and a plurality of pieces of wiring formed on the semiconductor substrate to be used only for testing.

Therefore a semiconductor device based on a design suitable for facilitating testing can be obtained by using a semiconductor substrate having sufficiently large wiring formation regions.

Preferably, the pieces of wiring for testing only are connected to the pads for testing of the chip IPs provided on the semiconductor wiring substrate.

On the semiconductor substrate, a multilayer wiring layer may be formed in which a plurality of wiring layers and a plurality of insulating layers are alternately superposed. The pieces of wiring for testing only may be formed in one of the layers in the multilayer wiring layer below the uppermost layer, and may be located below the pads. Therefore this wiring structure can also be used in the case where the pads are formed in a grid pattern.

The above-described pieces of wiring for testing only may be formed in two of the above-described plurality of wiring layers so as to intersect with each other as seen in a plan view, and conductor portions are formable by dielectric breakdown between the testing pads and the two wiring layers at the points of intersection of the pieces of wiring. Thus, wiring routes can be formed as desired.

According to a sixth device of the present invention, there is provided a semiconductor device including a semiconductor wiring substrate having a wiring layer, a plurality of chip IPs mounted on the semiconductor wiring substrate by being bonded thereto, a boundary scan test circuit provided in each of the chip IPs, and an internal scan chain for an internal scan test. The scan chain is formed in each of the chip IPs and can operate simultaneously with the boundary scan test circuit.

If scan-in and scan-out terminals connected to the wiring in the wiring substrate are provided according to this arrangement, scan-in operation can be performed irrespective of the operation for the boundary scan test, so that the total test time can be reduced. In the IPOS device in particular, wiring to be used for a special purpose can easily be formed and the above-described testing circuit can therefore be formed easily.

At least one of scanning signal input terminals connected to the internal scan chain is a terminal specially formed separately from the boundary scan test circuit.

Thus, if scan-in and scan-out terminals connected to the wiring in the wiring substrate used for internally testing only, scan-in operation can be performed irrespective of the operation for the boundary scan test, so that the total test time can be reduced.

Each of in-chip chains in the boundary scan test circuit of the plurality of chip IPs is formed so as to also function as the internal scan chain in the chip IP. An input-side wiring branch and an output-side wiring branch which respectively branch off from an input-side end portion and an output-side end portion of the boundary scan test circuit are formed in each of the chip IPs. A scan-in terminal of the internal scan chain is connected to the input-side wiring branch, while a scan-out terminal of the internal scan chain is connected to the output-side wiring branch. An input to the in-chip chain can be selected from a signal in the boundary scan test circuit and a signal from the input-side wiring branch. Consequently, the boundary scan test and the scan test on the internal circuit can be speedily made.

According to a seventh device of the present invention, there is provided a semiconductor device including a semiconductor wiring substrate having a wiring layer, a plurality of chip IPs mounted on the semiconductor wiring substrate by being bonded thereto, a boundary scan test circuit provided in each of the chip IPs, at least two pieces of wiring formed in the wiring layer of the semiconductor wiring substrate to be used only for testing, and an input terminal and an output terminal for a boundary scan test connected to the boundary scan test circuit in each of the chip IP and respectively connected to the two pieces or wiring for testing only.

In this arrangement, a test pattern for the boundary scan test can be separately supplied to each chip IP, thus achieving a reduction in test time.

The boundary scan test circuit in the plurality of chip IPs is formed so to also function as an internal scan test circuit in the chip IPs. An input-side wiring branch and an output-side wiring branch which respectively branch off from an input-side end portion and an output-side end portion of the boundary scan test circuit are formed in each of the chip IPs. A scan-in terminal through which an internal scan test signal is input is connected to the input-side wiring branch. A scan-out terminal through which a scan test result is output is connected to the output-side wiring branch. Also, an input to the in-chip chain can be selected from a signal in the boundary scan test circuit and a signal from the wiring branch. Thus, it is possible to reduce the test time by changing the chain length between BST and BIST.

The boundary scan test circuit in the plurality of chip Ips is formed integrally with the internal scan chain in the wiring layer of semiconductor siring substrate. First special-purpose wiring for supplying a control signal supplied to the internal scan chain in each of the chip IPs and second special-purpose wiring for outputting a signal from the internal scan chain in each of the chip IPs are also provided. A scan-in terminal of the internal scan chain in each of the chip IPs is connected to the first special-purpose wiring, while a scan-out terminal of the internal scan chain in each of the chip IPs is connected to the second special-purpose wiring. Thus, the entire chain is not formed and the entire structure is simplified. This structure is particularly suitable for IPOS devices.

According to a first method of the present invention, there is provided a method for testing a semiconductor device including a logic circuit having a boundary scan test function and a built-in self-test (BIST) function, the method comprising combining a built-in logic block observer (BILBO) function with the boundary scan test function of the logic circuit, and making a boundary scan test and a built-in self-test (BIST) on the logic circuit.

This method enables a BILBO test to be made on peripheral portions outside the external terminals, where testing based on the conventional method is difficult.

According to still a second method of the present invention, there is provided a method for testing a semiconductor device including a logic circuit having a boundary scan test function and a built-in self-test (BIST) function, the method comprising providing a built-in logic block observer (BILBO) function in the logic circuit, and making a boundary scan test and a BIST on the logic circuit by supplying a linear feedback shift register (LFSR) signal as a boundary scan test signal to the logic circuit and by compressing boundary scan test results.

This method enables a BILBO test to be made on peripheral portions outside the external terminals.

According to still an eighth device of the present invention, there is provided a semiconductor device including a semiconductor wiring substrate having a wiring layer, a plurality of chip IPs mounted on the semiconductor wiring substrate by being bonded thereto, a scan test circuit provided in each of the chip IPs, the scan test circuit having a plurality of scan-in terminals and the same number of scan-out terminals as the number of the scan-in terminals, and a plurality of pieces of wiring formed in the wiring layer of the semiconductor wiring substrate to be used only for testing. A control signal is supplied to the scan test circuit of each of the chip IPs through the pieces of wiring. The number of the pieces of wiring is equal to the number of the scan-in terminals. The scan-in terminals of the scan test circuit in each of the chip IPs are respectively connected to the pieces of wiring for testing only.

This arrangement enables the scan test to be separately made on the internal circuit of each chip IP, thereby reducing the scan test time.

A gate may also be provided which is connected to each of the scan-in terminals. The gate sets an input to the scan-in terminals to a fixed value when a mode other than the scan test mode is selected. Thus, it is possible to reduce the power consumption by inhibiting the operation of the chip IPs other than the current test object.

According to a ninth device of the present invention, there is provided a semiconductor device including a semiconductor wiring substrate having a wiring layer, a plurality of chip IPs mounted on the semiconductor wiring substrate by being bonded thereto, a scan test circuit provided in each of the chip IPs, the scan test circuit having a plurality of scan-in terminals and the same number of scan-out terminals as the number of the scan-in terminals, and a plurality of pieces of wiring formed in the wiring layer of the semiconductor wiring substrate to be used only for testing. A control signal is supplied to the scan test circuit of each of the chip IPs through the pieces of wiring. The number of the pieces of wiring is equal to the number of the scan-out terminals. The scan-out terminals of the scan test circuit in each of the chip IPs are respectively connected to the pieces of wiring for testing only.

A gate may be further provided which is connected to each of the scan-out terminals and has a high-impedance when a mode other than a scan test mode is selected, thereby preventing mixing of test outputs from the ship IPs in the wiring for testing only.

According to a ninth device of the present invention, there is provided a semiconductor device including a semiconductor wiring substrate having a wiring layer, a plurality of chip IPs mounted on the semiconductor wiring substrate by being bonded thereto, a scan test circuit provided in each of the chip IPs, the scan test circuit having a plurality of scan-in terminals and the same number of scan-out terminals as the number of the scan-in terminals, and clock wiring formed in the wiring layer of the semiconductor wiring substrate, the clock wiring being used only for supplying a clock signal to the scan test circuit of each of the chip IPs. A clock terminal of the scan test circuit in each of the chip IPs is connected to the clock wiring.

Each chip IP is connected to the common clock wiring to enable the circuits in the chips IP to operate in synchronization with each other by a small clock skew.

According to a tenth device of the present invention, there is provided a semiconductor device comprising a semiconductor wiring substrate having a semiconductor substrate and a wiring layer formed on the semiconductor substrate, a plurality of chip IPs mounted on the semiconductor wiring substrate by being bonded thereto, and a test controller provided on the semiconductor wiring substrate for the purpose of controlling a circuit in each of the chip IPs.

The test controller is used to enable various tests to be easily made on each chip IP in the semiconductor device.

The above-described test controller may be constituted by a semiconductor element having a portion of the semiconductor substrate as its active region, or may be is provided as a chip IP on the semiconductor wiring substrate.

When the circuit in a first one of the plurality of chip IPs is separately tested by a scan method, if a boundary scan test circuit exists in the circuit in a second one of the chip IPs adjacent to the first one of the chip IPs, the test controller supplies a test pattern from an internal scan chain in the circuit in the first one of the chip IPs and executes an operation for connection to the boundary scan test circuit to simultaneously make the test on the circuit in the first one of the chip IPs and a test on the wiring between the first one of the chip IPs and the second one of the chip IPs, it can be determined, by using the boundary scan test circuit of the adjacent chip IPs, simultaneously, whether the internal circuit of the chip IP is defective or not, and whether the wiring connection states between the chip IP and adjacent chip IP is defective or not.

The circuit in each of the chip IPs has a linear feedback shift register (LFSR) function, a multiple input signature register (MISR) function and a BIST function. The test controller supplies a signal from a linear feedback shift register (LFSR) to a scan-in terminal of each of the chip IPs and makes a multiple input signature register (MISR) take in a signal from a scan-out terminal of each of the chip IPs. The functions necessary for the BIST on each chip IP are thus combined in one chip IP to enable centralized control of the test, thus achieving the effect of reducing the scale of the circuit in each chip IP.

The semiconductor device may further has a function for controlling the power supply voltage to each of the chip IPs, such that the test controller supplies the power supply voltage only to the circuit in the chip IP subjected to a test among the plurality of chip IPs and stops supply of the power supply voltages to the other chip IPs. This control makes it possible to reduce the power consumption at the time of testing and, hence, to prevent a malfunction of the components of each chip IP at the time of testing.

According to still a further aspect of the present invention, there is provided a mounting method for a semiconductor device, comprising a step (a) of mounting a plurality of chip IPs on a semiconductor wiring substrate having a wiring layer by bonding the chip IPs to the semiconductor wiring substrate, a step (b) of making a go-no-go test on the plurality of chip IPs and a step (c) of substituting another chip IP of the same type for the chip IP determined as a defective one in the step (b), and making the go-no-go test on the substituted chip IP. The step (c) is repeated until the substituted chip IP is determined as a nondefective one.

This method ensures improved reliability of the IPOS device and facilitate mounting of the components.

DETAILED DESCRIPTION OF THE INVENTION

Fundamental Structure as Basis for the Present Invention

According to the present invention, an arrangement in which chip IPs incorporating various devices are mounted on a semiconductor wiring substrate having a wiring layer, e.g., a silicon wiring substrate (Super-Sub) is used as a means for realizing a semiconductor device incorporating multiple kinds of semiconductor devices having multiple functions while maintaining a large wiring piece sectional area. A circuit (IC) formed in each chip IP can be treated as an intellectual property (IP) in designing the semiconductor device, and the semiconductor device may be considered a group of various IPs bonded to a surface of a semiconductor wiring substrate. That is, the entire semiconductor device is "IP On Super-Sub". In the description of embodiments of the present invention in this specification, the entire semiconductor device having a silicon substrate and a group of IPs is referred to as "IPOS device".

Figure 1A:
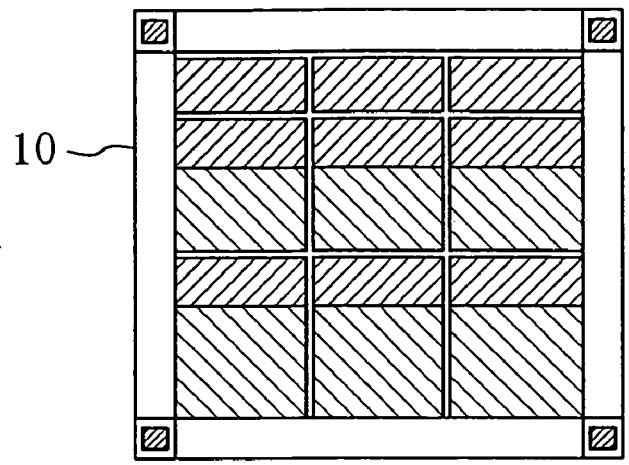
FIG. 1A is a plan view of a silicon wiring substrate used as a wiring substrate on which a group of IPs are mounted.
Figure 1B:
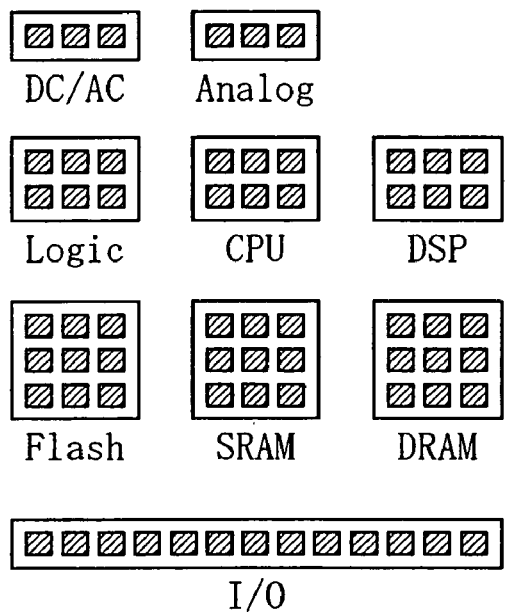
FIG. 1B is a plan view of an example of a group of IPs mounted on the silicon wiring substrate.
Figure 1C:
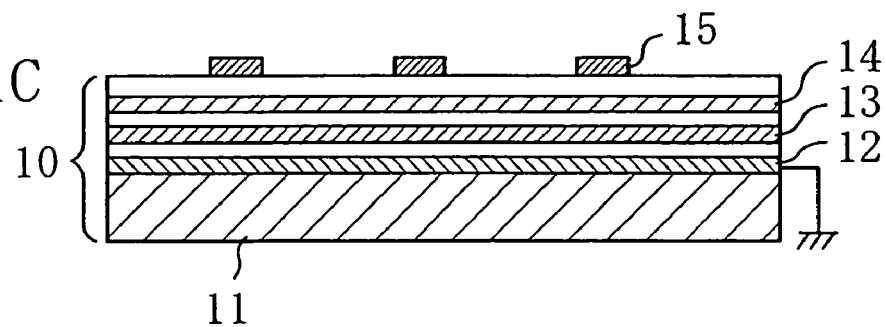
FIG. 1C is a cross-sectional view of the silicon wiring substrate.

FIG. 1A is a plan view of a silicon wiring substrate used as a wiring substrate on which a group of IPs (chip IPs) are mounted, FIG. 1B is a plan view of an example of a group of IPs mounted on the silicon wiring substrate, and FIG. 1C is a cross-sectional view of the silicon wiring substrate. As shown in FIGS. 1A and 1B, a plurality of regions for mounting various IPs are defined on a silicon wiring substrate 10, and a group of IPs, e.g., a DC/AC-IP, an analog-IP, a logic-IP, a CPU-IP, a DSP-IP, a flash memory-IP, a SRAM-IP, a DRAM-IP, and I/O-IP can be mounted as chip IPs in the substrate regions. As shown in FIG. 1C, the silicon wiring substrate 10 includes a silicon substrate 11, a ground plane 12, a first wiring layer 13, a second wiring layer 14, and pads 15. The ground plane 12 is formed on the silicon substrate 10 with an insulating layer (not shown) interposed therebetween. The first wiring layer 13 is formed on the ground plane 12 with an interlayer insulating film interposed therebetween. The second wiring layer 14 is formed on the first wiring layer 13 with an interlayer insulating film interposed therebetween. The pads 15 are formed on the second wiring layer 14 with a passivation film interposed therebetween. Connections are established by contacts (not shown) between the pads 15, the wiring layers 13 and 14, and the ground plane 12 at desired positions. The IPs are placed on and bonded to the pads 15 to be electrically connected to each other through the wiring layers 13 and 14 or to the ground plane 12. The silicon wiring substrate 10 is thus constructed.

The restrictions on the size of pieces of wiring in the wiring layers 13 and 14 of the silicon wiring substrate 10 are moderate and pieces of wiring having a width of several microns can be formed. This wiring structure is advantageous as described below. Wiring having the wiring piece size corresponding to that of the wiring empirically recognized as having best wiring characteristics in the course of miniaturization of semiconductor integrated circuit devices to date can be provided. Also, the electrical impedance of wiring can be reduced.

The chip IPs on the silicon wiring substrate have many functions. However, there are two conceptions about the functions of chip IPs: one which resides in maximizing the number of functions to be used, and one which resides in limiting the number of functions to be used. That is, while it is desirable to arrange a device so that the device has such a configuration as to be adaptable to various methods for use to meet various user demands, there is a need to limit the device to some functions in practice. That is, if these two contradictory requirements are satisfied, it is possible to construct an IPOS device satisfying various user needs and suitable for reduced-variety mass production. Therefore means for selecting, limiting and setting intrinsic multiple functions of an IPOS device are required. Such means are realized as a method of evaluating the functions of chip IPs on the silicon wiring substrate, a method of selecting functions, an on-chip configuration, etc. Embodiments of the present invention will be described with respect to examples of such means.

Embodiment 1

Figure 2:
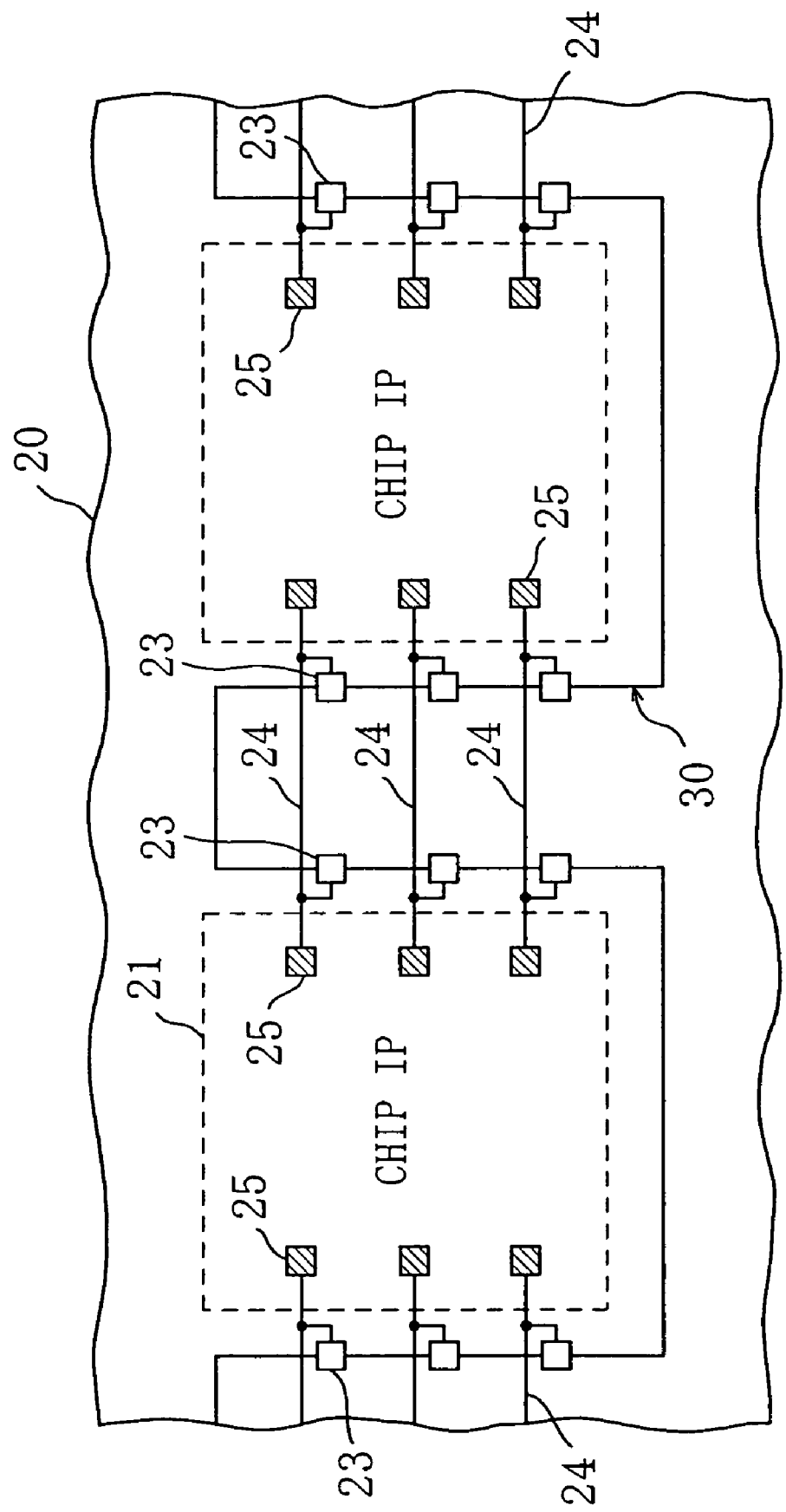
FIG. 2 is a block diagram showing the circuit configuration on the silicon wiring substrate in a first embodiment of the present invention.

FIG. 2 is a block diagram showing a circuit configuration on a silicon wiring substrate 20 of a first embodiment of the present invention. On the silicon wiring substrate 20 are formed pads 25 connected to pads of chip IPs by diffusion junction or the like, and pieces of wiring 24 for connection between pairs of the pads 25 (between two chip IPs 21 and 22). This embodiment is characterized in that flip flops 23 are respectively provided in the vicinity of and below end portions of the pieces of wiring 24 located in regions where the chip IPs are mounted (regions indicated by broken lines in the figure). That is, two flip flops 23 are provided at positions close to opposite ends of each piece of wiring 24. The position of each flip flop 23 may be such that the flip flop overlaps the chip IP or does not overlap the chip IP. A scan chain 30 is formed in which the flip flops 23 are successively connected. A boundary scan test can be carried out by using this scan chain 30. For example, one boundary scan test selected from various types of boundary scan test to be carried out in this embodiment is such that a test pattern signal (e.g., "100111101...") is supplied from each of flip flops 23 provided in the vicinity of the region where chip IP 21 for example is mounted to the corresponding piece of wiring 24 through the pad 25 and is taken out through the flip flop 23 provided in the vicinity of the next-stage chip IP 22. By comparison between the signal thus obtained and the input test pattern, a break, a short or the like in the wiring 24 can be detected.

Figure 3A:
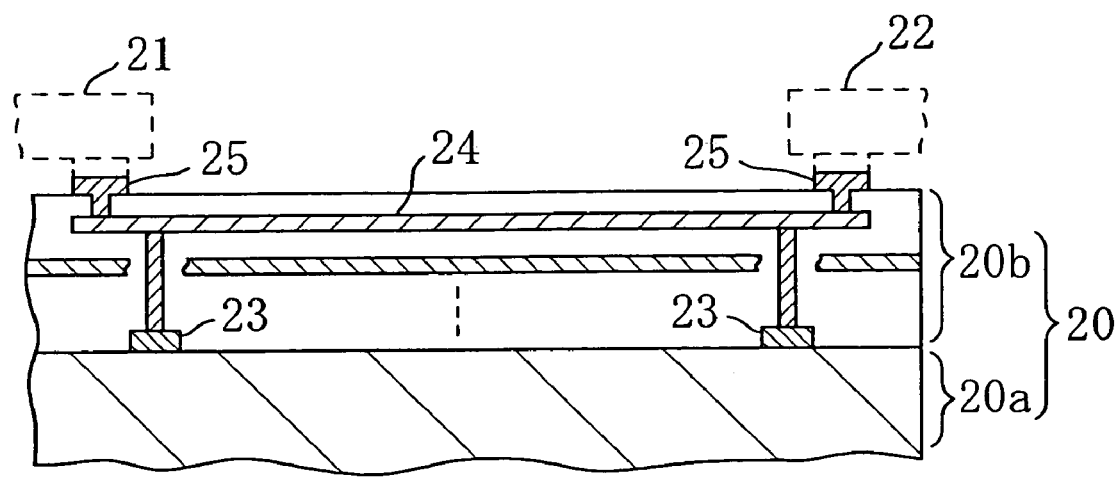
FIG. 3A is a cross-sectional view of an arrangement in which flip flops are provided on the silicon substrate in the silicon wiring substrate.
Figure 3B:
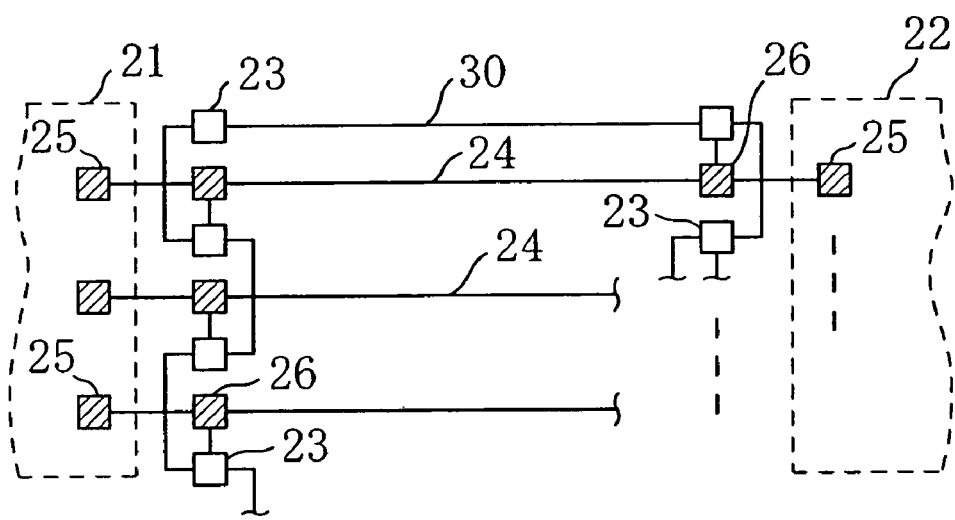
FIG. 3B is a block diagram of an arrangement in which flip flops are provided on the silicon wiring substrate.

FIG. 3A is a cross-sectional view showing an example of an arrangement in which flip flops are provided on the silicon substrate in the silicon wiring substrate, and FIG. 3B is a block diagram showing an example of an arrangement in which flip flops are provided above the silicon wiring substrate.

In the example shown in FIG. 3A, a multilayer wiring layer 20b having a plurality of wiring layers between which an insulating layer is interposed is provided on a silicon substrate 20a, and each of flip flops 23 is constituted by a plurality of MOS transistors using portions of silicon substrate 20a as source and drain regions. A well-known MOS transistor combination and a well-known connection between MOS transistors, not shown in the figure, may be used in the flip flops 23. The flip flops 23 are connected to each other by wiring provided in one of wiring layers on the silicon substrate 20a. Pieces of wiring 24 for connection between pads 25 are provided, for example, in the uppermost wiring layer. In the pieces of wiring 24, the pads 25 and external connection terminal pads of chip IPs 21 and 22 indicated by the broken line are connected to each other by using diffusion junction or the like between metals.

In the example shown in FIG. 3B, flip flops 23 constituted by thin-film transistors (TFTs) are placed on the silicon wiring substrate, and are connected to pieces of wiring 24 through pads 26. The flip flops 23 and the pads 26 are connected by the wiring on the silicon wiring substrate to form a scan chain 30.

In this embodiment, at a point in time when chip IPs are not mounted after the formation of the silicon wiring substrate 20, it is possible to check defective/nondefective condition of wiring in the silicon wiring substrate even though the chip IPs do not exist. That is, in a semiconductor device tested by a conventional boundary scan test, devices which receive a signal are provided in logic circuits. In this arrangement, the boundary scan test is carried out after mounting of chip IPs. However, it is desirable that a semiconductor device such as an IPOS device in which various chip IPs are mounted on the silicon wiring substrate (Super-Sub) according to user demands have such flexibility that variations of the structure of the silicon wiring substrate are minimized and the kinds of chip IPs to be mounted are selected according to orders. In this embodiment, at the point in time when the silicon wiring substrate is formed, defective/nondefective condition of wiring in the wiring layer on the silicon wiring substrate without mounting chip IPs on the silicon wiring substrate. Therefore a large number of silicon wiring substrates whose quality is guaranteed can be prepared while excluding defective ones.

Embodiment 2

Figure 4:
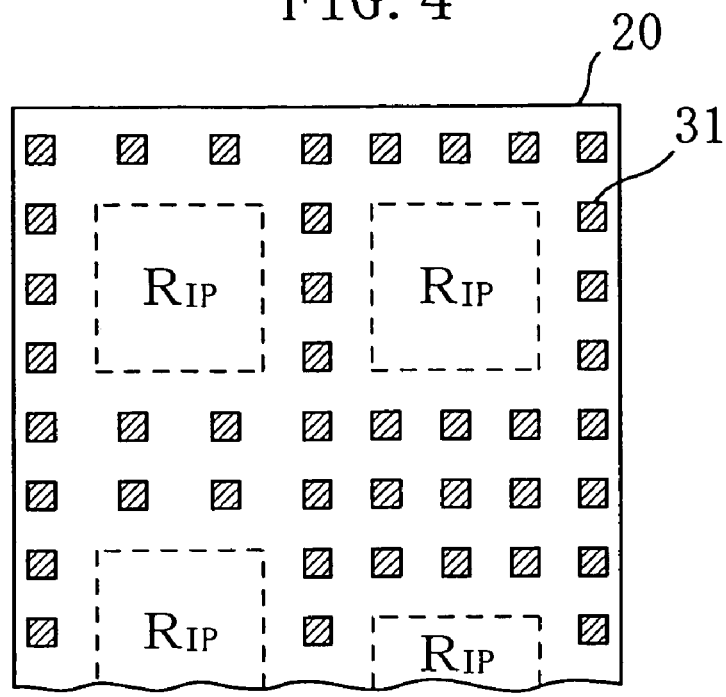
FIG. 4 is a schematic plan view of the structure of an IPOS device in a second embodiment of the present invention.

FIG. 4 is a schematic plan view of the structure of an IPOS device in a second embodiment of the present invention. As shown in FIG. 4, the IPOS device of this embodiment has testing pads 31 are placed in a grid pattern on a silicon wiring substrate 20 in regions other than regions $R_{IP}$ where IPs are to be mounted.

After chip IPs have been mounted on the silicon wiring substrate 20, a scan test or a BIST on the chip IPs can be carried out by using some of the testing pads 31 selected as desired. That is, in this embodiment, with respect to any of various kinds of chip IP mounted in the chip mount regions $R_{IP}$, a testing method can be selected according to the kind of chip IP and carried out. Different kinds of testing circuit to be used in combination of groups of testing pads may be provided.

Figure 5:
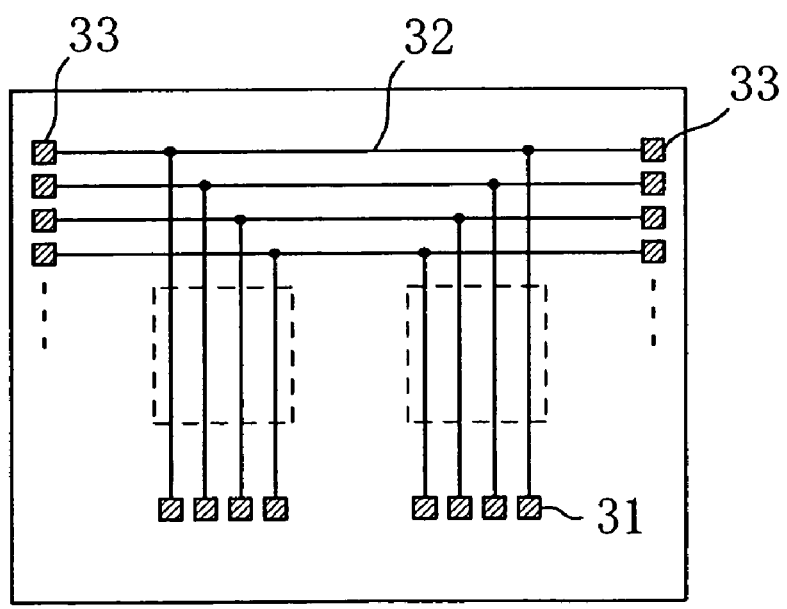
FIG. 5 is a schematic plan view of the structure of testing wiring in the second embodiment.

FIG. 5 is a schematic plan view of the structure of testing wiring in this embodiment. As shown in FIG. 5, pieces of testing wiring 32 for connecting testing pads 31 to external terminals 33 are formed so as to extend in vertical and horizontal directions, thereby ensuring use of a multiplicity of testing pads 31.

Figure 6A:
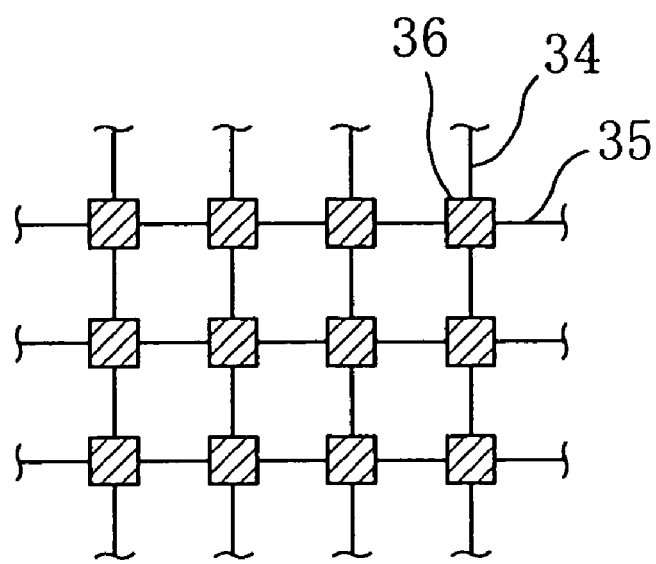
FIGS. 6A and 6B are a plan view and a cross-sectional view, respectively, of an example of a modification of the IPOS device in the second embodiment.
Figure 6B:
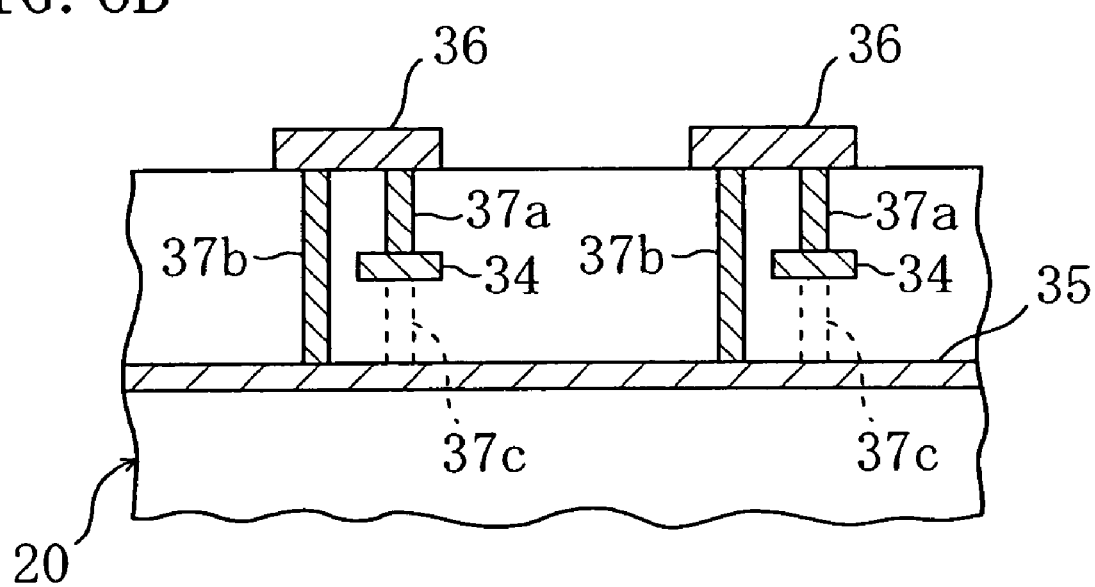

FIGS. 6A and 6B are a plan view and a cross-sectional view, respectively, of an example of a modification of the IPOS device in this embodiment. In this example of modification, testing pads 36 are formed in a grid pattern on the entire surface of a silicon wiring substrate 20, and a multiplicity of pieces of testing wiring 34 extending in parallel with each other and a plurality of pieces of testing wiring 35 extending by intersecting the pieces of testing wiring 34 are also provided. At one point of intersection, the pieces of testing wiring 34 and 35 and the testing pad 36 are connected to each other by plugs 37a and 37b formed by dielectric breakdown. At some of the intersections other than those shown in FIG. 6B, different types of connections are made, including one using only a plug formed between the pieces of wiring 34 and 35, one using only plug 37a for connection between the testing pad 36 and the piece of wiring 34, and one using plug 37b for connection between the testing pad 36 and the piece of wiring 35. Further, at some of the other intersections, no plug is formed. Thus, wiring routes can be freely formed according to the kind of chip IP, etc.

Another modification of this embodiment is conceivable in which plugs made of a fuse wire are formed in advance at the positions corresponding to plugs 37a, 37b, and 37c, and each plug is cut by energization or left unchanged to obtain the desired testing wiring structure.

Embodiment 3

Figure 7:
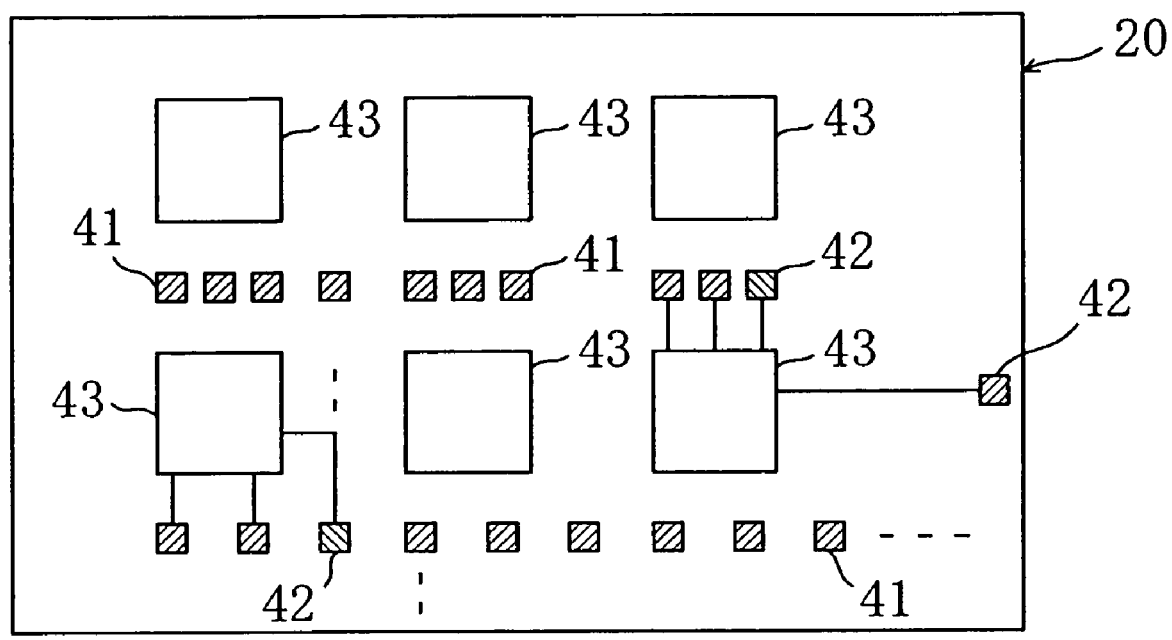
FIG. 7 is a plan view of an IPOS device in a third embodiment of the present invention.

FIG. 7 is a plan view of an IPOS device in a third embodiment of the present invention. In this embodiment, a multiplicity of chip IPs 43 and a multiplicity of testing pads 41 are placed on a silicon wiring substrate 20. In this embodiment, power supply pads 42 to be used only at the time of testing are provided.

In this embodiment, additional power supply pads 42 to be used only at the time of testing are provided to achieve an effect described below. In general, a chip IP design for reducing power consumption by allowing only part of chip IPs to operate at a time can be adopted by considering an increased power consumption when all the chip IPs 43 operate simultaneously in actual use. Ordinarily, such a power consumption setting is made to limit the power consumption during operation in actual use. However, at the time of testing without consideration of power consumption, there is a possibility of all the chip IPs 43 on the IPOS device operating at a time. Since the entire IPOS device is designed in accordance with a power consumption requirement with respect to actual use, there is a risk of a malfunction resulting from lack of power when all the chip IPs in the IPOS device are operated for testing. In this embodiment, therefore, power supply pads 42 to be used only at the time of testing are provided and additional power is supplied only at the time of testing, thereby avoiding lack of power.

Embodiment 4

A fourth embodiment of the present invention relating to an isolation test will be described. A test referred to as an isolation test is characterized by an arrangement using a selector and wiring for testing. An internal circuit of a chip IP is accessible from the outside through its external connection terminal if the chip IP is singly mounted. Once the chip IP is confined in an IPOS device, it is difficult to access the internal circuit of the chip IP. In a large-scale integrated circuit device such as a system LSI, therefore, a selector is inserted in a signal line between circuits, wiring for connection between one input portion of the selector and an external connection terminal is provided, an output signal from the circuit in the preceding stage and a signal from the output connection terminal is selectively input to the circuit in the following stage, thus enabling each circuit to be singly tested.

Figure 8:
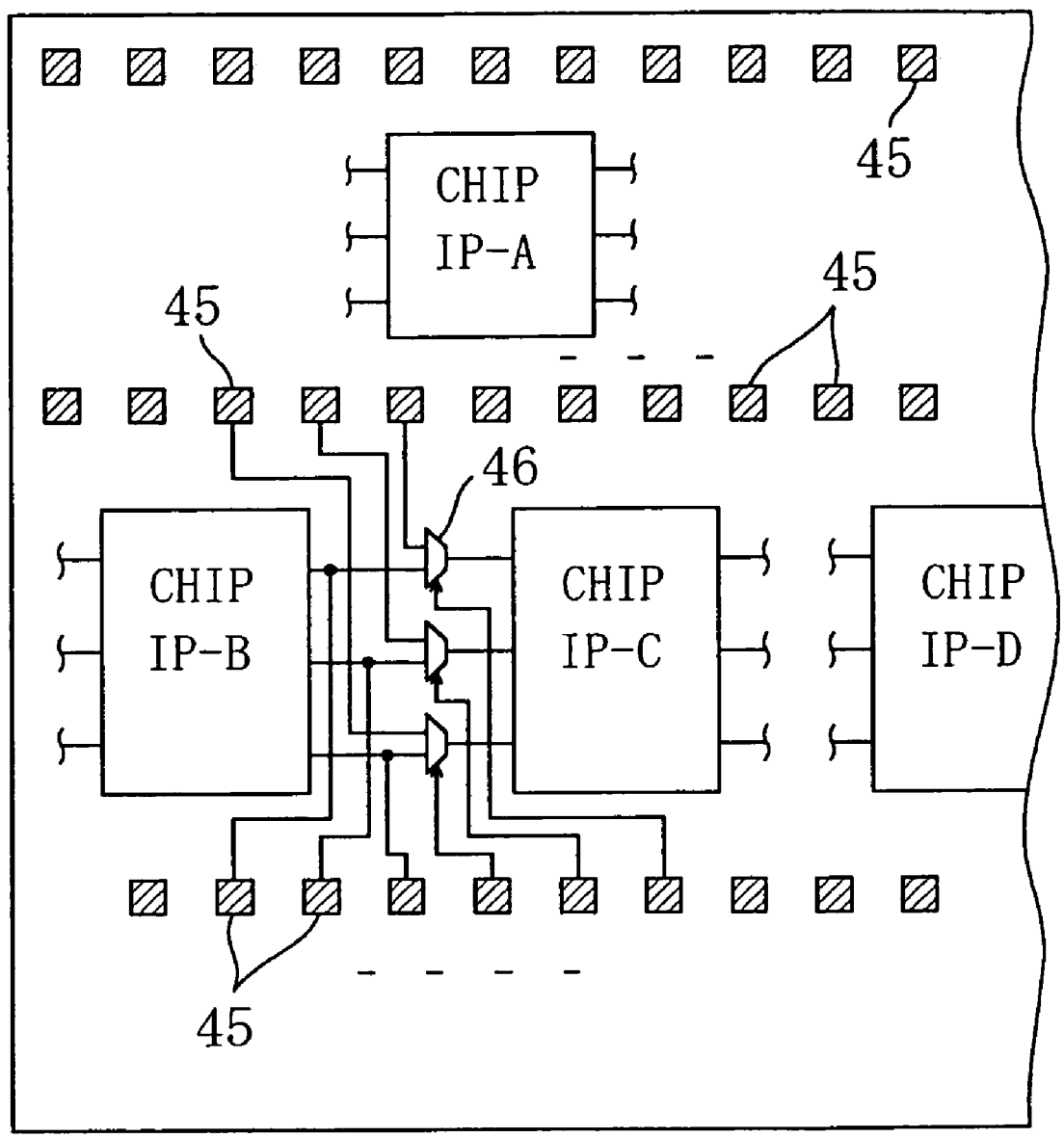
FIG. 8 is a plan view of an IPOS device in a third embodiment of the present invention.

FIG. 8 is a plan view of an IPOS device of this embodiment. In this embodiment, as shown in FIG. 8, a selector 46 is inserted in each of signal lines between each adjacent pair of a chip IP-A, a chip IP-B, a chip IP-C, a chip IP-D, . . . and a signal line connecting a testing pad 45 and an input portion of the selector 46 is provided to enable each chip IP to be singly tested. Also, a signal line connecting an input change control portion of the selector 46 and a testing pad 45 and a signal line connecting an output signal line from each chip IP and a testing pad 45 are also provided. That is, the testing pads 45 are used for inputting a testing signal (test pattern), for extracting the testing signal, and for control of testing.

According to this embodiment, various tests can be made on each chip circuit in a manner similar to a test made of each chip IP in a state of being singly operated outside the device. For example, a scan test may be made on each chip IPs by inputting a test pattern to the chip IP from the corresponding selector.

Embodiment 5

Figure 9A:
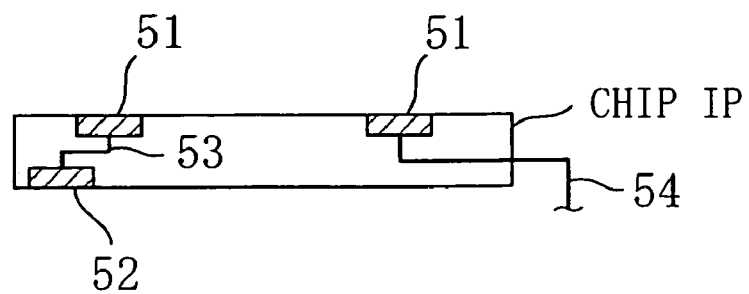
FIG. 9A is a cross-sectional view of a single chip IP in a second embodiment of the present invention.

A fifth embodiment of the present invention relating to a method of connecting testing pads in a case where a plurality of chip IPs are used in a superposed state will be described. FIG. 9A is a cross-sectional view of a single chip IP of this embodiment, and FIG. 9B is a cross-sectional view of an IPOS device of this embodiment.

As shown in FIG. 9A, first testing pads 51 are provided in an upper surface of the chip IP of this embodiment, while second testing pads 52 are provided in a lower surface of the chip IP. Although only two testing pads 51 and one testing pads 52 are illustrated in FIG. 9A, there are other testing pads which can be seen in other cross sections. A multiplicity of first testing pads 51 and a multiplicity of second testing pads 52 are provided. Some of the first testing pads 51 are connected to the second testing pads 52 by wiring 53, while the other first testing pads 51 are connected to pads on a silicon wiring substrate for example.

Figure 9B:
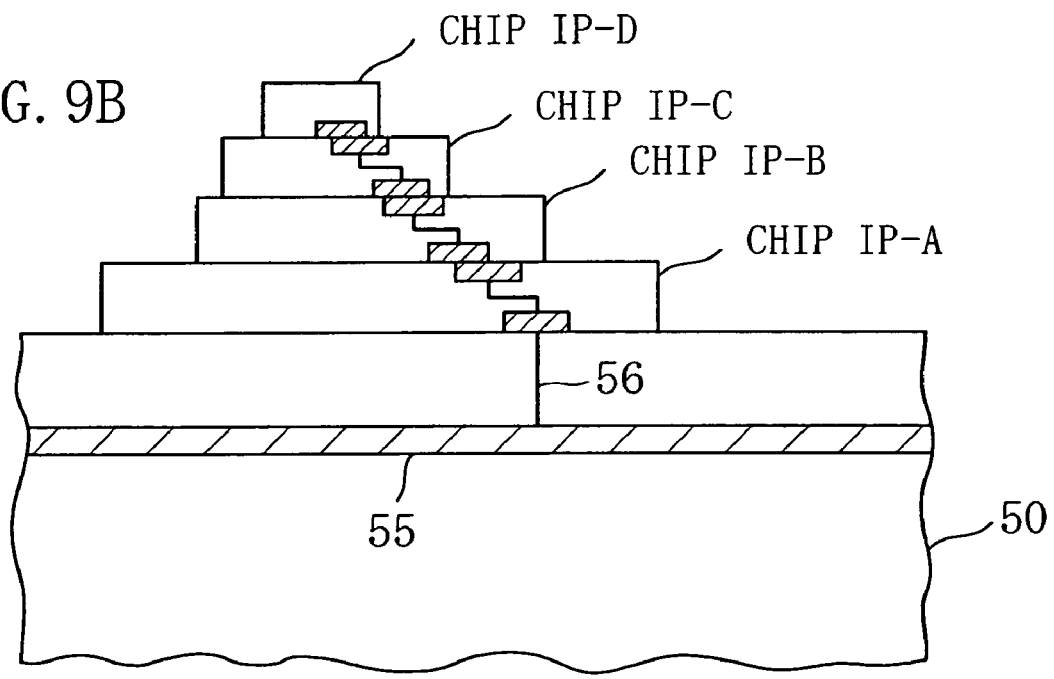
FIG. 9B is a cross-sectional view of an IPOS device in the second embodiment.

As shown in FIG. 9B, a chip IP-A, a chip IP-B, a chip IP-C, and a chip IP-D are placed on a silicon wiring substrate 50 while being superposed one on another. The second testing pads of the chip IP-A at the lowermost position are connected to a wiring layer 55 in the silicon wiring substrate 50 via the plug 56.

Embodiment 6

Figure 25:
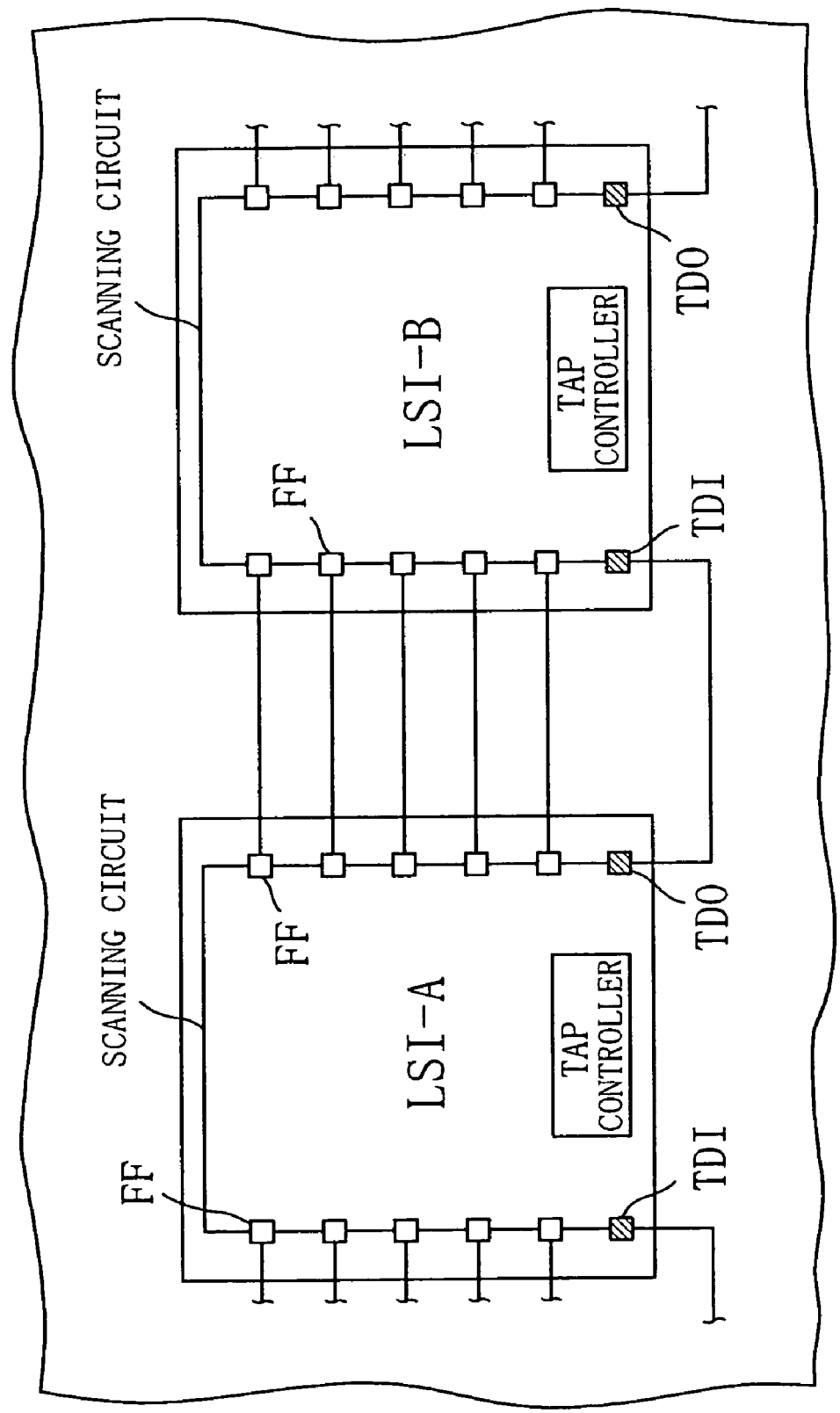
FIG. 25 is a block diagram schematically showing an ordinary boundary scan test circuit.
Figure 26:
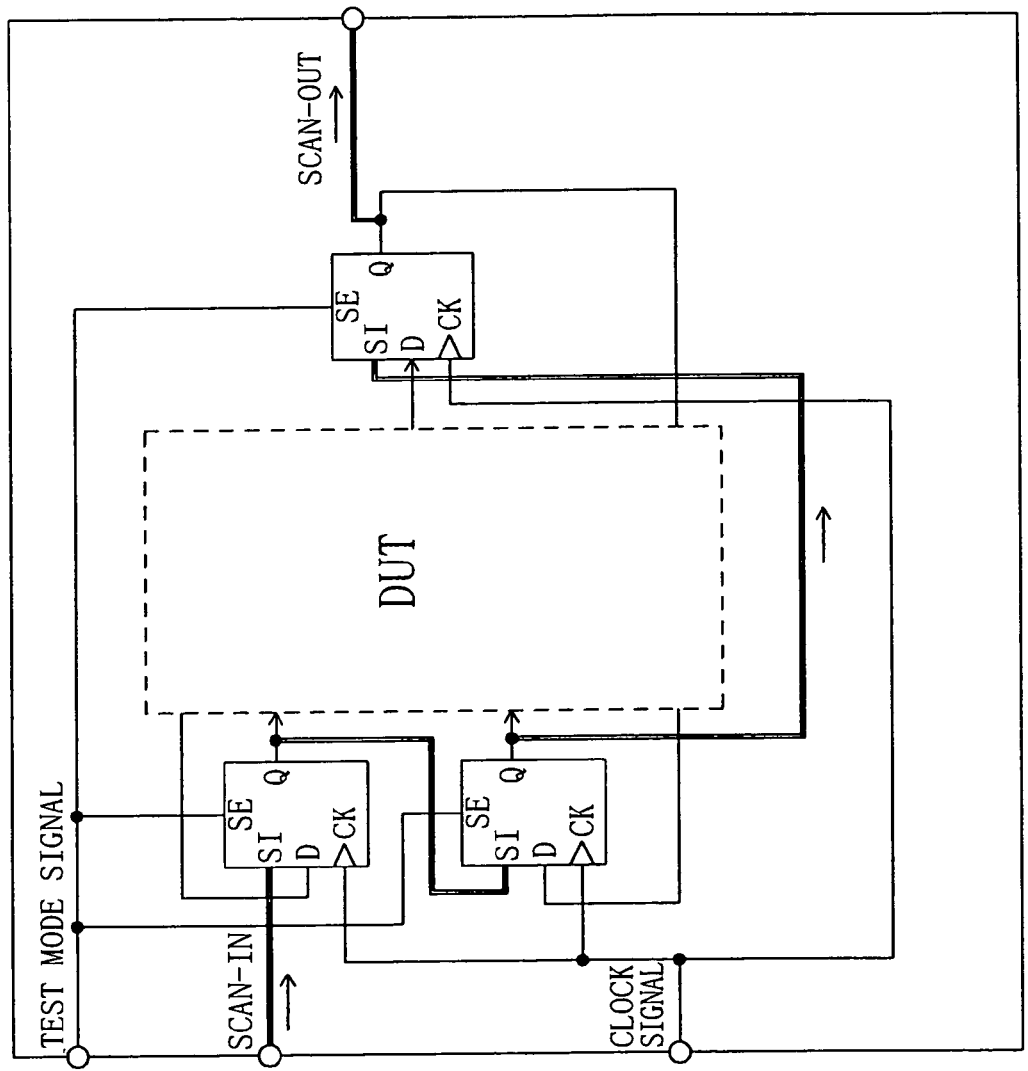
FIG. 26 is a block diagram showing an example of a configuration of a scan chain used in an ordinary scan test.
Figure 27:
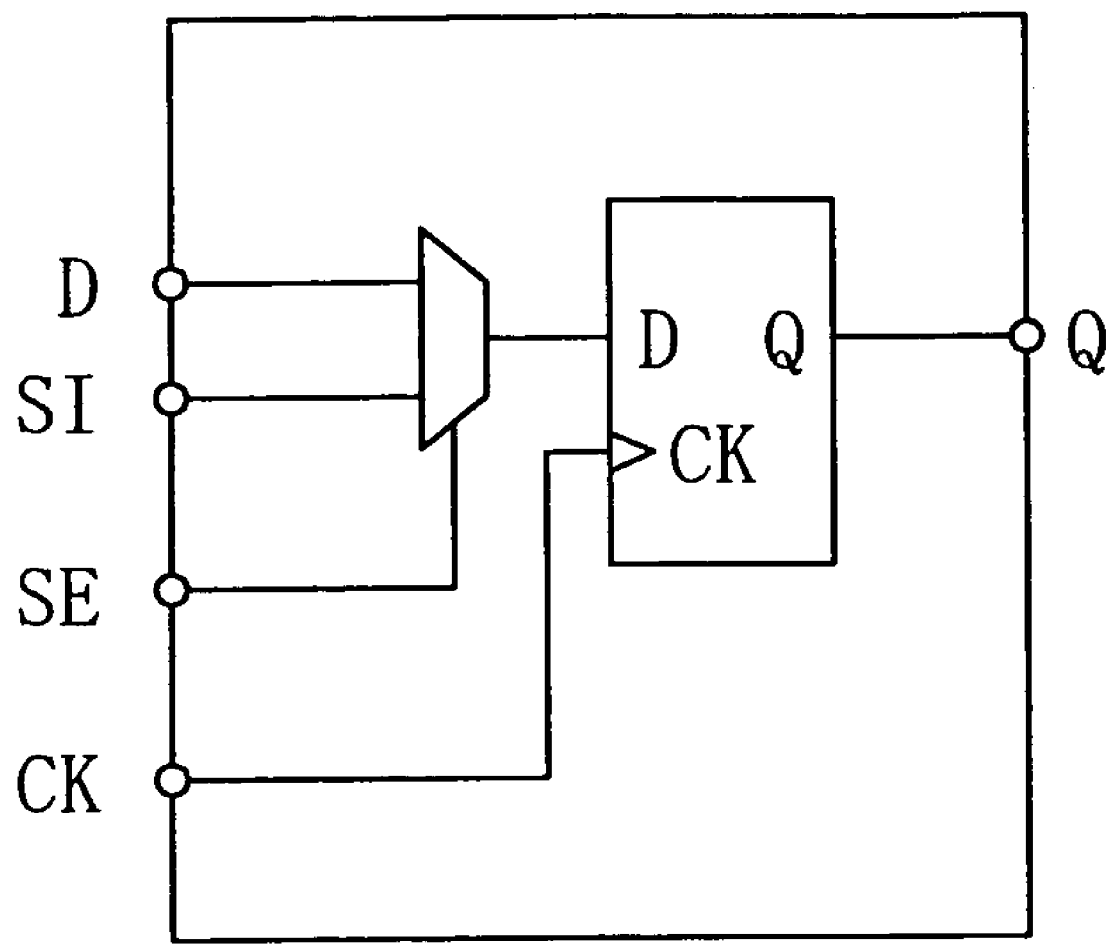
FIG. 27 is a block diagram showing an example of a configuration of a flip flop provided in a boundary test circuit or a scan chain for a scan test of internal circuits.

A sixth embodiment of the present invention relating to various tests for separately checking each of a plurality of chip IPs will be described. In a case where a test for separately checking each of a plurality of chip IPs is made after the chip IPs have been mounted and incorporated in an IPOS device, an internal test on the internal circuit may be made by using a boundary scan test circuit in the chip IP. However, if scanning in each of a boundary scan test pattern and an internal test pattern is performed by using the conventional boundary scan test circuit (e.g., one shown in FIG. 25), a considerably long test time is required. This embodiment will be described with respect to means for carrying out an internal test and a boundary test with efficiency.

FIRST EXAMPLE

Figure 10:
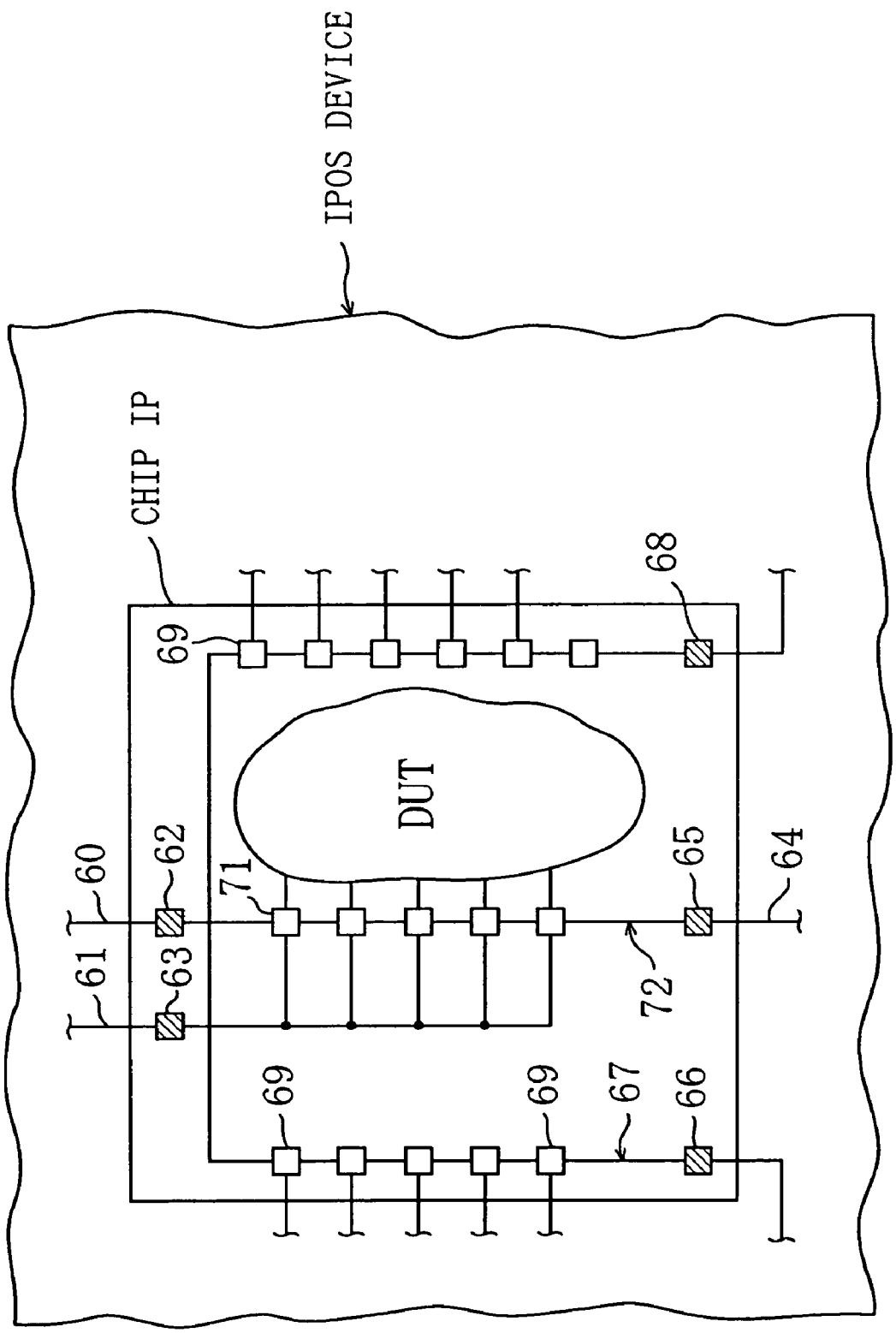
FIG. 10 is a block diagram showing the configuration of a portion of an IPOS device in a first example of a sixth embodiment.

FIG. 10 is a block diagram showing the configuration of a portion of an IPOS device in a first example of this embodiment. As shown in FIG. 10, in the IPOS device of this embodiment, a first piece of testing wiring 60, which is used only for testing, and through which a scan-in signal (test pattern) is transmitted, a second piece of testing wiring 61, which is used only for testing, and through which a scanning enable signal is transmitted, and a third piece of testing wiring 64, which is used only for testing, and through which the result of an internal test is output, are provided on a silicon wiring substrate separately from wiring constituting a boundary scan test circuit 67. In each of chip IPs, a scan chain 72 is formed which connects, via flip flops 71, a scan-in terminal 62 through which an input from the first testing wiring 60 is received, a scan control input terminal 63 through which an input from a second testing wiring 61 is received, a signal output terminal 65 through which a scan-out signal is output to the third testing wiring 64, and an input terminal (TDI) 66 through which a boundary scan test signal is input to this chip IP. A scan test is made on the internal circuit in each chip IP (inspection object-DUT) by using this scan chain. The boundary scan test circuit 67 has an output terminal (TDO) 68 through which the boundary scan test signal is output out of the chip IP. The boundary scan test circuit 67 includes boundary scan registers (BSR) 69.

Figure 23A:
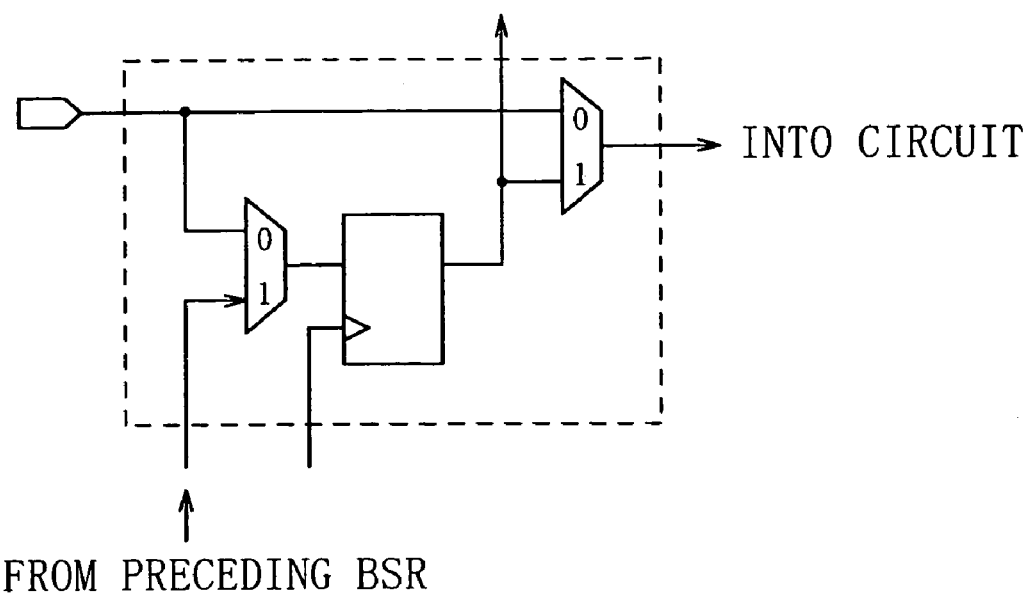
FIGS. 23A and 23B are block diagrams showing examples of the BSR used in the sixth embodiment.
Figure 23B:
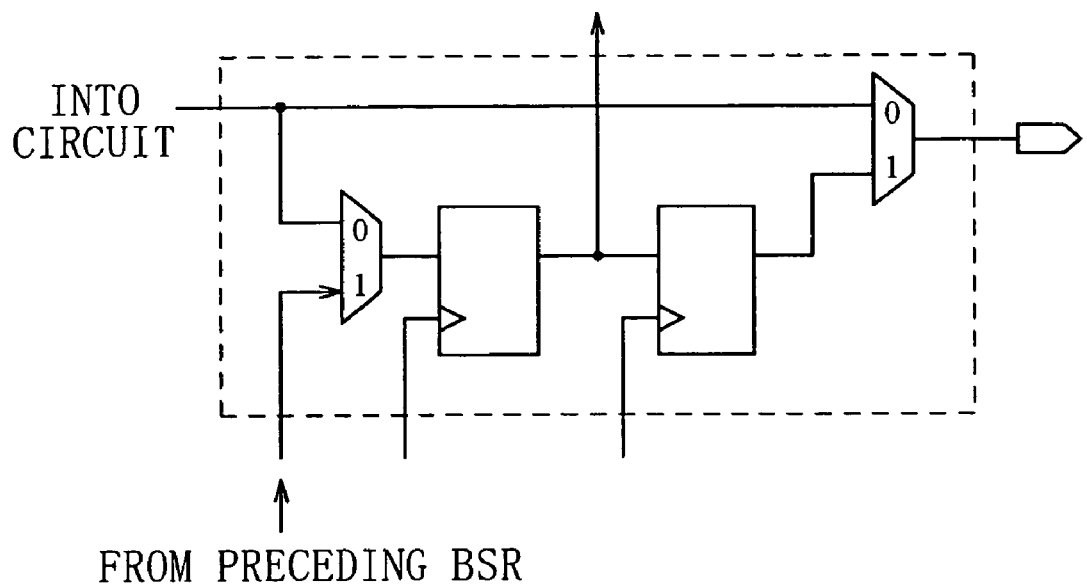

In this embodiment, "BSR" refers to a circuit such as shown in FIG. 23A or 23B, which uses a combination of flip flops and a selector and has a register function. The configuration shown in FIG. 23A is used as the portion of the boundary scan test circuit through which a signal is received from the piece of wiring subjected to wiring test, while the configuration shown in FIG. 23B is used as the portion through which a test pattern is output. However, there are many BSRs other than those shown in FIGS. 23A and 23B, and any other BSR may be used in the boundary scan test circuit of this embodiment.

In this embodiment and in each of embodiments described below, connections via external connection terminals are established between the flip flops or BSRs of the boundary scan test circuit in each adjacent pair of chip IPs. However, the external connection terminals are not shown in the drawings except for a special case.

According to this embodiment, if scan-in terminals and scan-out terminals connected to wiring on a wiring substrate used only for internal testing are provided, a scan-in test can be carried out irrespective of the operation for a boundary scan test while using part of the boundary scan test circuit 67, thus achieving a reduction in test time.

This testing method is made possible by providing, on a silicon wiring substrate, pieces of wiring 60, 61, and 64 used only for internal testing. That is, in conventional semiconductor integrated circuit devices, restrictions on wiring layout are so severe that the provision of wiring for testing only is not conceivable. On the other hand, semiconductor devices constructed by mounting semiconductor chips on a printed circuit board need not be designed by considering such wiring since external terminals from each semiconductor chip are exposed to facilitate internal testing using a tester or the like.

SECOND EXAMPLE

In a second example of this embodiment, each of BSRs 69 in an arrangement shown in FIG. 10 is arranged to output a signal even when an internal testing mode is selected. In this example, the advantage of eliminating the need for scan-out terminal 65 is obtained as well as the same effect as that of the first example. The scan-out signal output from each BSR 69 may enter a register.

THIRD EXAMPLE

Figure 11:
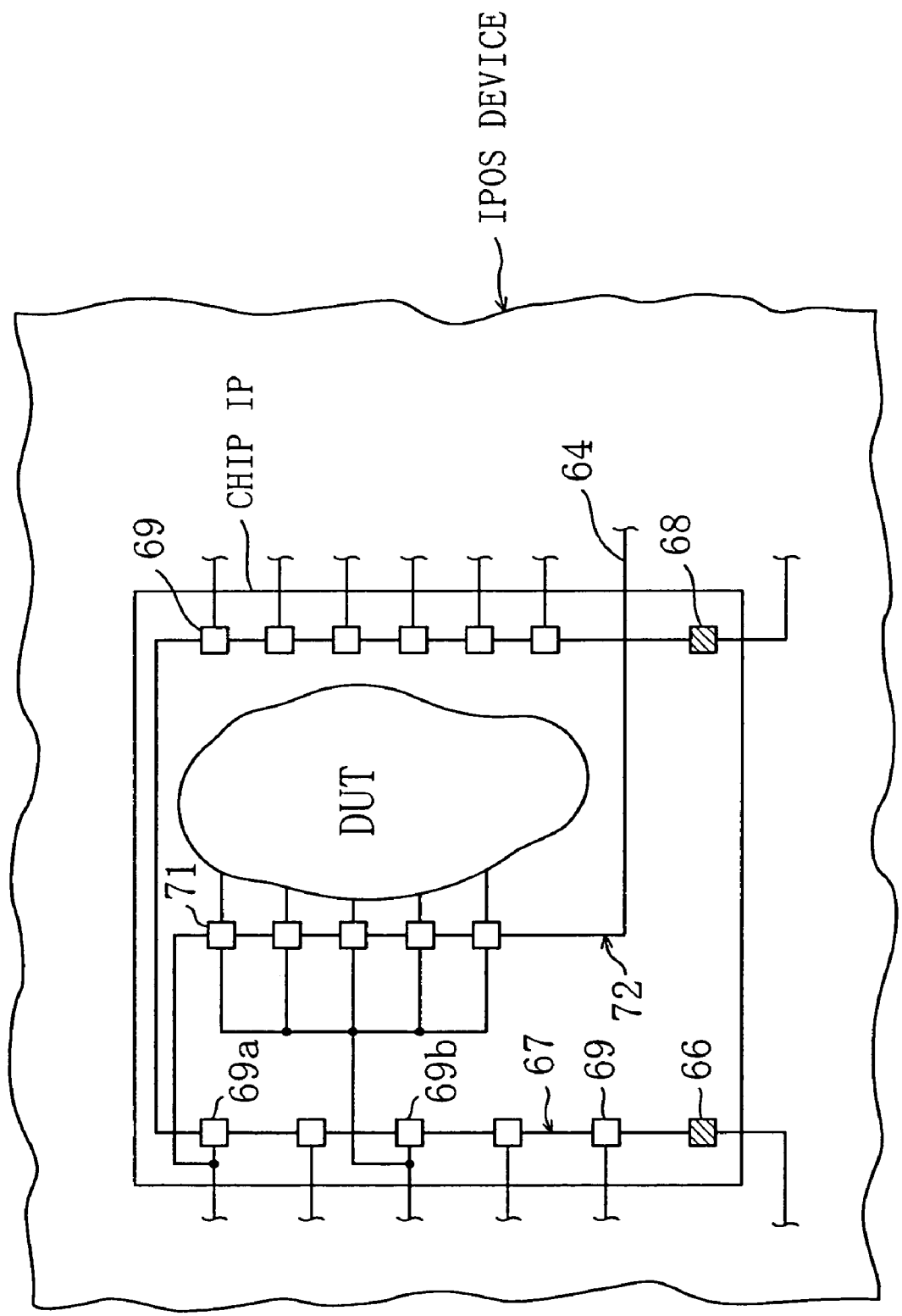
FIG. 11 is a block diagram showing the configuration of a portion of an IPOS device in a third example of the sixth embodiment.

FIG. 11 is a block diagram showing the configuration of a portion of an IPOS device in a third example of this embodiment. In this example, the first and second pieces of testing wiring 60 and 61 in the second example of this embodiment are not provided and only the third piece of testing wiring 64 is provided. A signal for internal testing and a scan enable signal are respectively input from BSRs 69a and 69b in the boundary scan test circuit 67.

The arrangement in this example has the advantage of reducing wiring provided on the silicon wiring substrate for testing only is in comparison with those in the first and second examples, but is comparatively disadvantageous in that the test time is long.

FOURTH EXAMPLE

Figure 12:
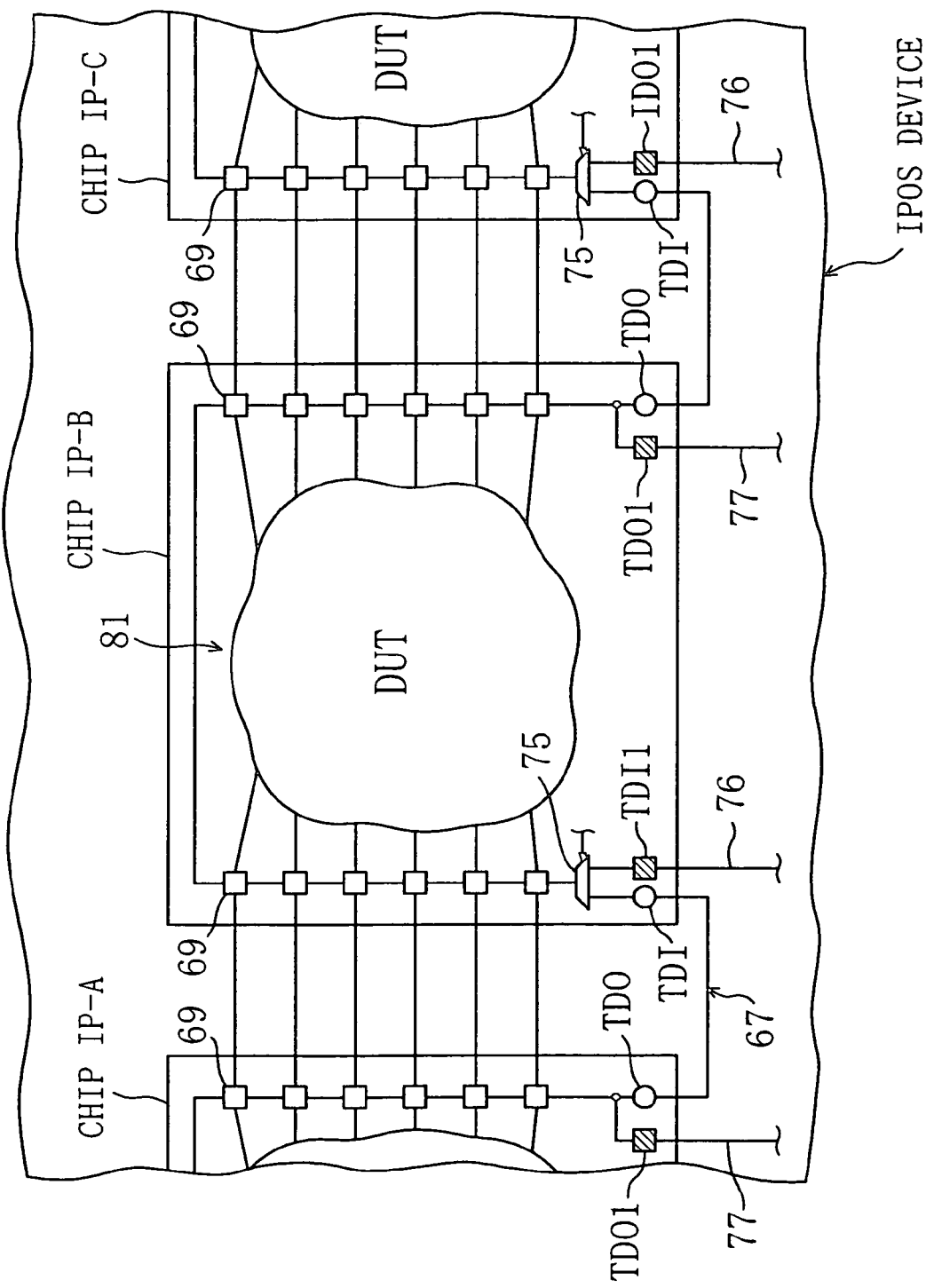
FIG. 12 is a block diagram showing the configuration of a portion of an IPOS device in a fourth example of the sixth embodiment.

FIG. 12 is a block diagram showing the configuration of a portion of an IPOS device in a fourth example of this embodiment. As shown in FIG. 12, a boundary scan test circuit (scan chain) 67 is formed by being connected through a chip IP-A, a chip IP-B, a chip IP-C, . . . In each chip IP are provided BSRs 69 arranged in the boundary scan test circuit (scan chain) 67, a standard input terminal TDI for inputting a boundary scan test signal to the chip IP, and a standard output terminal TDO for outputting the boundary scan test signal out of the chip IP. The arrangement in this example is characterized by the provision of a scan-in terminal TDI1 for inputting a test pattern for an internal test signal and a scan-out terminal TDO1 for outputting the result of a test using the internal test signal, and by the provision of a selector 75 for alternately selecting signals to be input to the boundary scan test circuit (in-chip chain) 67 from the standard input terminal TDI and the scan-in terminal TDI1. The scan-in terminal TDI1 and the scan-out terminal TDO1 are respectively connected to first and second pieces of wiring 76 and 77 for testing only, provided on the silicon wiring substrate. A control signal (scan enable) for control of the selector 75 may be input through the wiring for testing only or may be input through one of the BSRs 69. That is, a scan test on the internal circuit (DUT) of each chip IP is made by utilizing the boundary scan test circuit 67.

In this example, pieces of wiring branching off from the boundary scan test circuit 67 are formed outside the in-chip chain formed by the boundary scan test circuit 67, and inputting of a test pattern for a scan test on the internal circuits and outputting of the scan test result are performed by using, through these wiring branches, the wiring for testing only. Thus, the boundary scan test circuit 67 can be used for internal testing, while a test pattern for an internal test signal is effectively input by using the first and second pieces of wiring 76 and 77 for testing only in the same manner as in the first example of this embodiment.

FIFTH EXAMPLE

Figure 13:
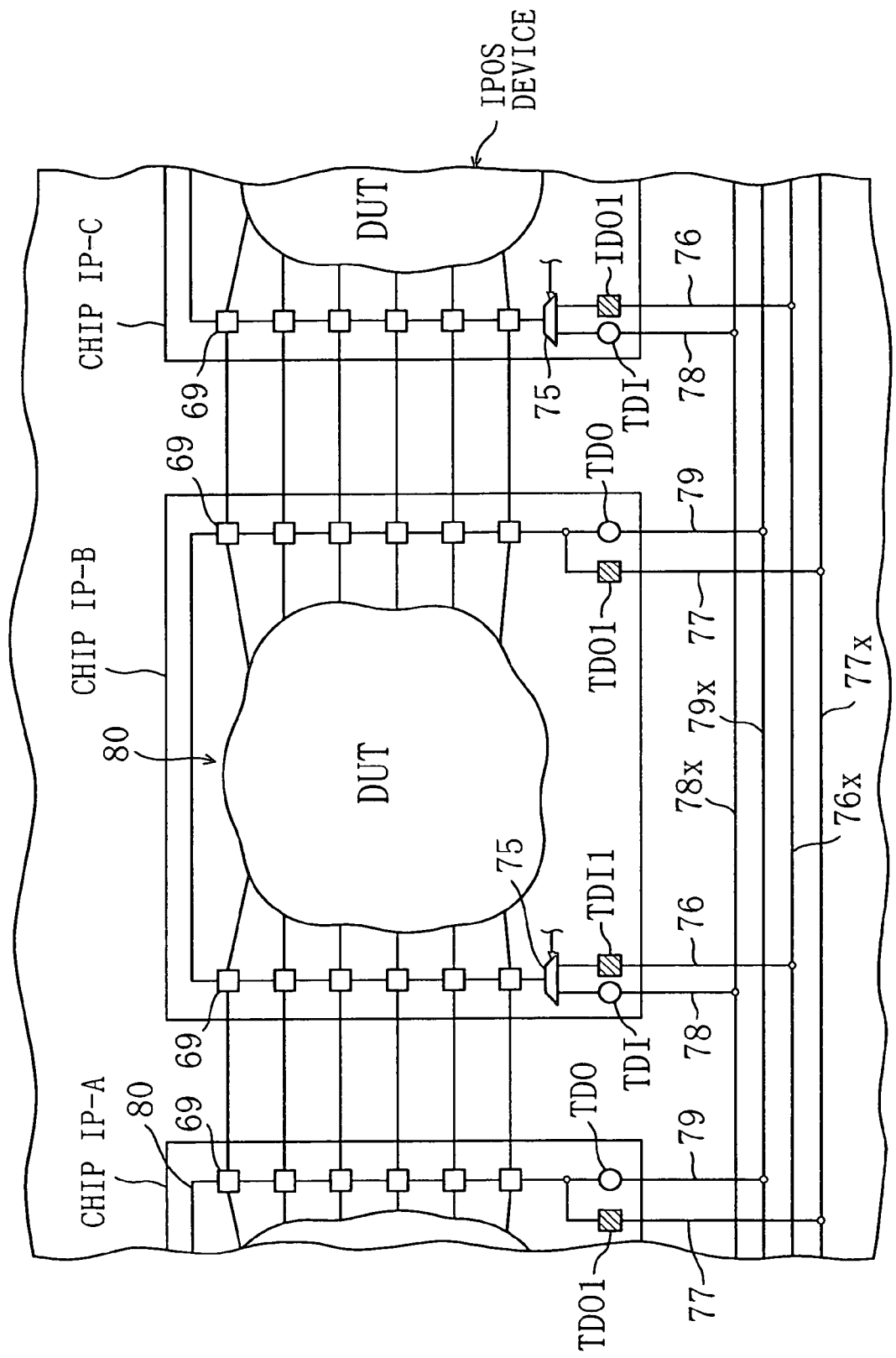
FIG. 13 is a block diagram showing the configuration of a portion of an IPOS device in a fifth example of the sixth embodiment.

FIG. 13 is a block diagram showing the configuration of a portion of an IPOS device in a fifth example of this embodiment. As shown in FIG. 13, no boundary scan test circuit (scan chain) 67 connected through a chip IP-A, a chip IP-B, a chip IP-C, . . . is provided in this example. In each of the chip IP-A, the chip IP-B, the chip IP-C, . . . are provided a boundary scan test circuit 80, BSRs 69 arranged in the boundary scan test circuit 80, a standard input terminal TDI for inputting a boundary scan test signal to the chip IP, a standard output terminal TDO for outputting the boundary scan test signal out of the chip IP, a scan-in terminal TD11 for inputting a test pattern for an internal test signal and a scan-out terminal TDO1 for outputting the result of a test using the internal test signal, and a selector 75 for alternately selecting signals to be input to the boundary scan test circuit (in-chip chain) 80 from the standard input terminal TDI and the scan-in terminal TDI1. The scan-in terminal TDI1 and the scan-out terminal TDO1 are respectively connected to first and second pieces of wiring 76 and 77 for testing only, and the standard input terminal TDI and the standard output terminal TDO are respectively connected to third and fourth pieces of wiring 78 and 79 for testing only. The first to fourth pieces of testing wiring 76 to 79 extending from each chip IP are connected to first to fourth common testing wiring 76x to 79x. Also in this example, a scan test on the internal circuit (DUT) of each chip IP is made by utilizing the boundary scan test circuit 80.

Also in this example, a control signal (scan enable) for control of the selector 75 may be input through the wiring for testing only or may be input through one of the BSRs 69.

In this example, instead of the boundary scan test circuit formed by being connected in series through the chip IPs, the boundary scan test circuits 80 are formed in parallel with each other in correspondence with the chip IPs by using the third and fourth pieces of wiring 78x and 79x for testing only. Consequently, the time required for inputting the test pattern for the boundary scan test is remarkably reduced, while the same effect as that of the fourth example is obtained. Thus, the effect of reducing the test time in this example is particularly high.

Embodiment 7

Figure 24:
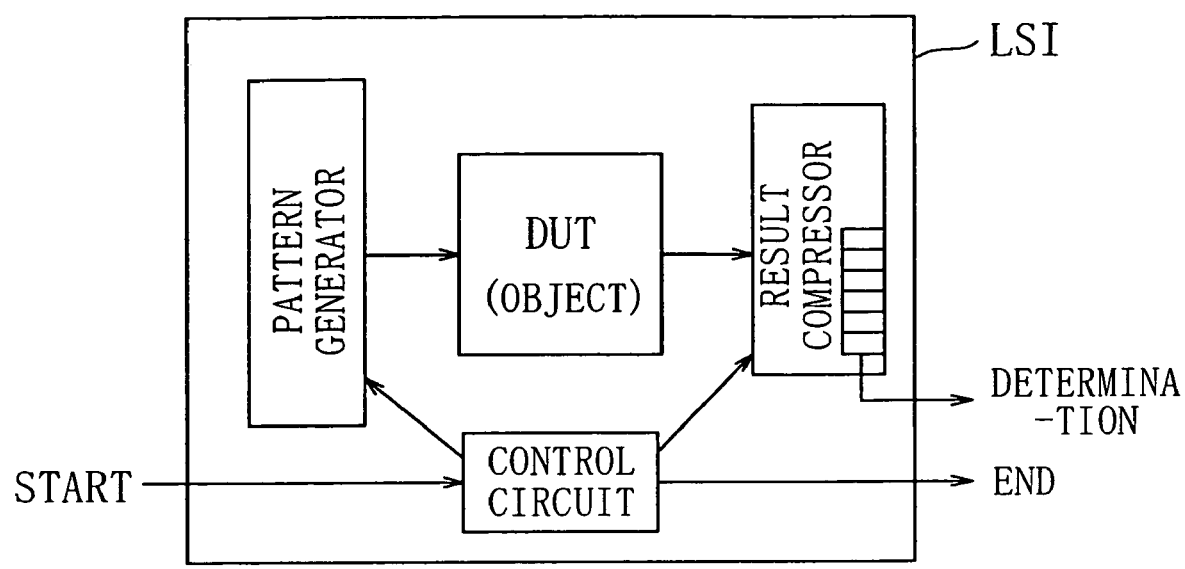
FIG. 24 is a block diagram for explaining a conventional ordinary built-in self-test (BIST).

A seventh embodiment of the present invention relating to a test based on a BIST method will next be described. As described above, a BIST is known as one of the conventional logic circuit testing methods (see FIG. 24). The conventional BIST requires that the inspection object (DUT) be a combination circuit, and therefore has the problem that an untested region exists between the external connection terminals of the logic circuit and the inspection object. This embodiment will be described with respect to means for solving this problem. Each of examples of this embodiment described below is an example of application of the present invention in the form of this embodiment to an IPOS device. However, this embodiment of the present invention is not limited to the examples described below. The present invention in the form of this embodiment can be applied to systems other than IPOS devices, for example, a system in which semiconductor chips are mounted on a printed circuit board, and a three-dimensional device system.

FIRST EXAMPLE

Figure 14:
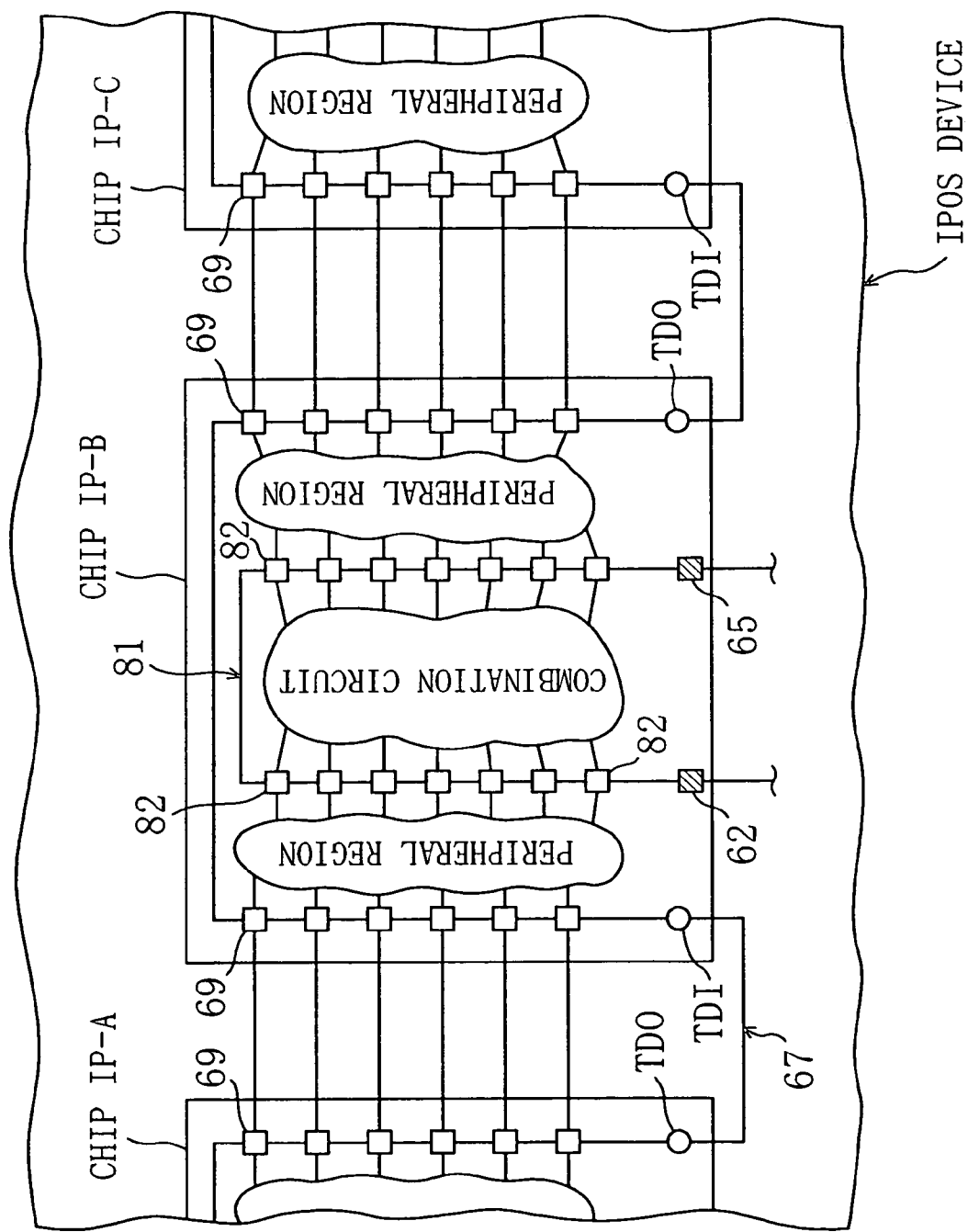
FIG. 14 is a block diagram showing the configuration of a portion of an IPOS device in a first example of a seventh embodiment of the present invention.

FIG. 14 is a block diagram showing the configuration of a portion of an IPOS device in a first example of this embodiment. As shown in FIG. 14, a boundary scan test circuit 67 is formed by being connected through a chip IP-A, a chip IP-B, a chip IP-C, . . . and a BIST circuit 81 is formed in each chip IP. BSRs 69 are arranged in the boundary scan test circuit 81, and flip flops 82 are arranged in the BIST circuit 81. In this example, each of the boundary scan test circuit 67 and the BIST circuit 81 has built-in logic block observer (BILBO) functions. The BILBO functions are a combination of functions necessary for a BIST and a scanning function. That is, each of the boundary scan test circuit 67 and the BIST circuit 81 is a circuit having a linear feedback shift register (LFSR) function for generating a pseudo random test pattern for a BIST, a function for compressing test results, and a scanning function. In each chip IP are provided a standard input terminal TDI for inputting a boundary scan test signal to the chip IP, a standard output terminal TDO for outputting the boundary scan test signal out of the chip IP, a scan-in terminal 62, and a scan-out terminal 65.

In this example, a BIST and a boundary scan test can be carried out by using the boundary scan test circuit 67 and the BIST circuit 81. Conventionally, only combination circuits can be tested if only the BIST circuit 81 is used. In contrast, in this example of the present invention, a BIST can be made on peripheral regions existing between each combination circuit and the external terminals. Consequently, tests for ensuring high reliability can be made with efficiency.

SECOND EXAMPLE

Figure 15:
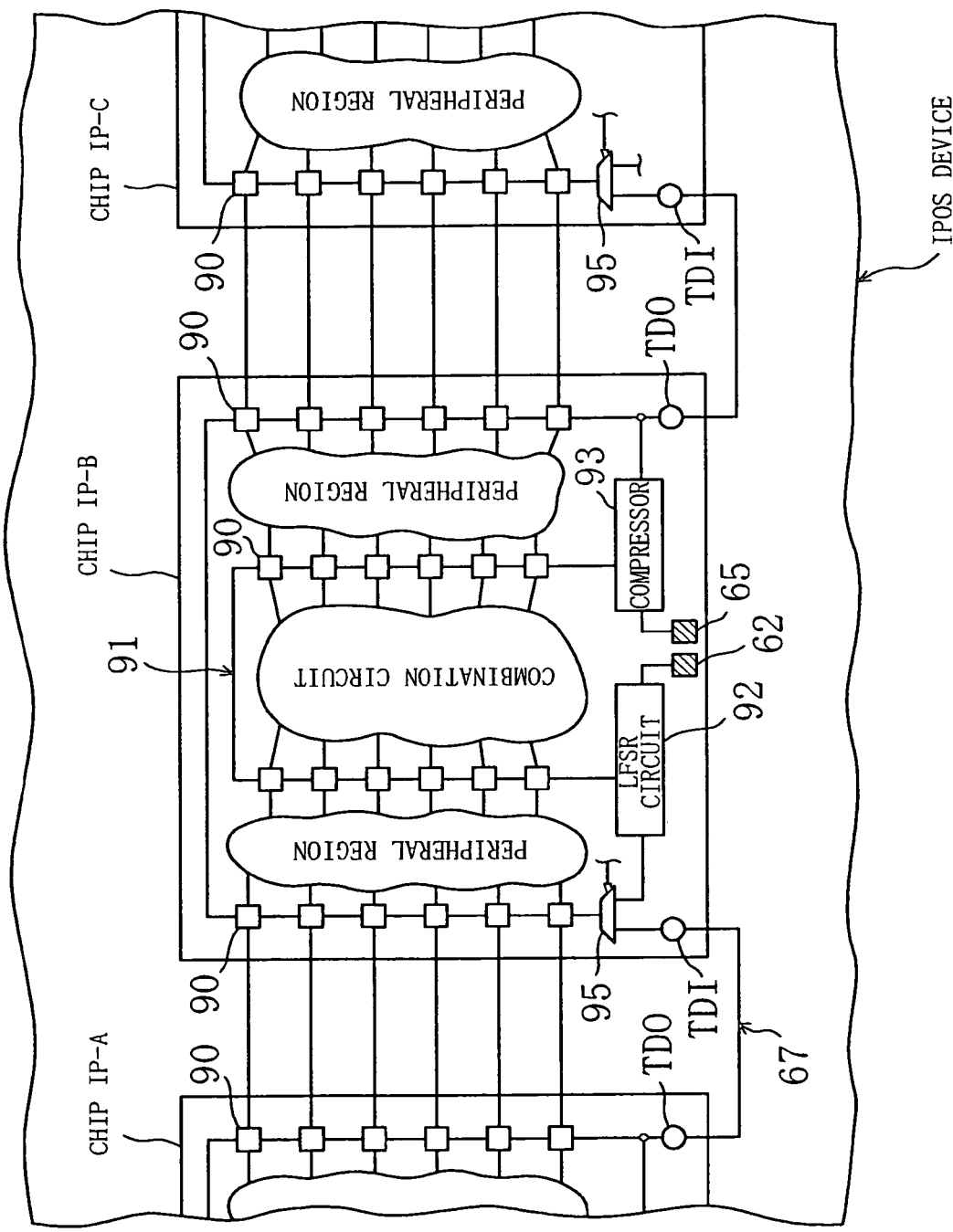
FIG. 15 is a block diagram showing the configuration of a portion of an IPOS device in a second example of the seventh embodiment.

FIG. 15 is a block diagram showing the configuration of a portion of an IPOS device in a second example of this embodiment. As shown in FIG. 15, a boundary scan test circuit 67 is formed by being connected through a chip IP-A, a chip IP-B, a chip IP-C, ... and a BIST circuit 81 is formed in each chip IP. BSRs 69 are arranged in the boundary scan test circuit 67, and flip flops 90 are arranged in the BIST circuit 81. In each chip IP are provided a standard input terminal TDI for inputting a boundary scan test signal to the chip IP, and a standard output terminal TDO for outputting the boundary scan test signal out of the chip IP. The arrangement in this example is characterized by the provision of a linear feedback shift register (LFSR) circuit 92 for generating a pseudo random test pattern for a BIST, the provision of a compressor 93 for compressing BIST results, and the provision of a selector 95 for alternately selecting signals to be input to the boundary scan test circuit 67 from the standard input terminal TDI and the output of the LFSR circuit 92. A control signal (scan enable) for control of the selector 95 may be input through the wiring for testing only or may be input through one of the flip flops 90.

Also in this example, a BIST and a boundary scan test can be carried out by using the boundary scan test circuit 67 and the BIST circuit 81. While in the conventional art only the BIST circuit 81 is used to enable only a test on combination circuits, a BIST in this example of the present invention can be made on peripheral regions existing between each combination circuit and the external terminals. Consequently, tests for ensuring high reliability can be made with efficiency.

As mentioned above, the method of carrying out a BIST and a boundary scan test in accordance with the present invention by using the BIST circuit and the boundary scan test circuit is not limited testing on IPOS devices. However, in the case of application of this embodiment to IPOS devices, specific effects described below can be achieved.

Figure 16:
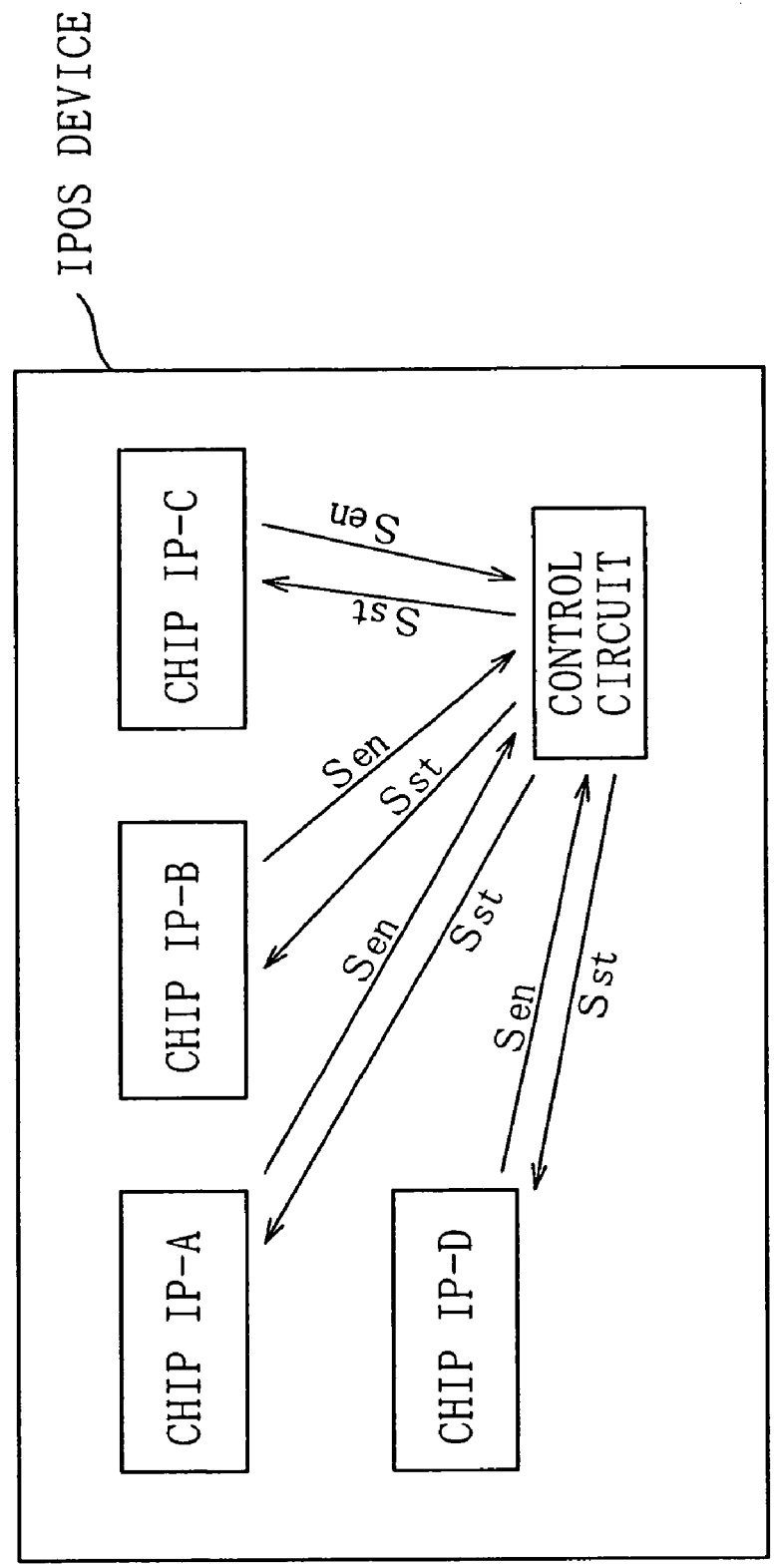
FIG. 16 is a block diagram schematically showing a test in the IPOS device in the example of the seventh embodiment.

In general, BIST techniques facilitate testing on circuits. Referring to FIG. 16, in a case where a chip IP-A, a chip IP-B, a chip IP-C, ... exist in an IPOS device, a control circuit provided on a silicon wiring substrate of the device outputs a test start instruction Sst to each chip IP and, after a while, a test result is returned as a test end signal Sen to the control circuit. Thus, the process of separately testing each chip IP is performed extremely easily. That is, there is no need for inputting of a test pattern and comparison between the test pattern and the test result signal, which are required in the case of a scan test, and the test on each unit test object can therefore be made extremely easily.

Embodiment 8

An eighth embodiment of the present invention will be described with respect to means for separately testing each chip IP by a scan test method.

Figure 17A:
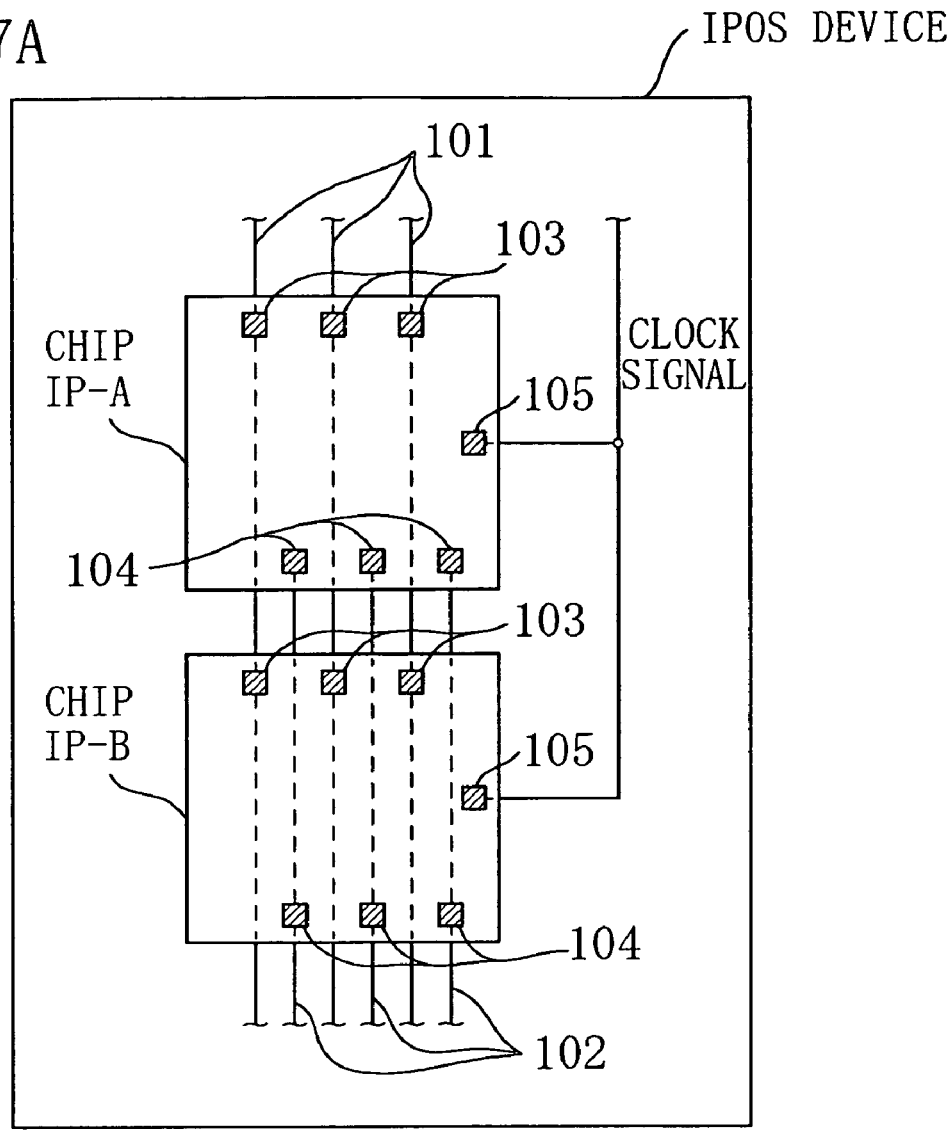
FIG. 17A is a plan view of the configuration of a portion of an IPOS device in an eighth embodiment of the present invention.
Figure 17B:
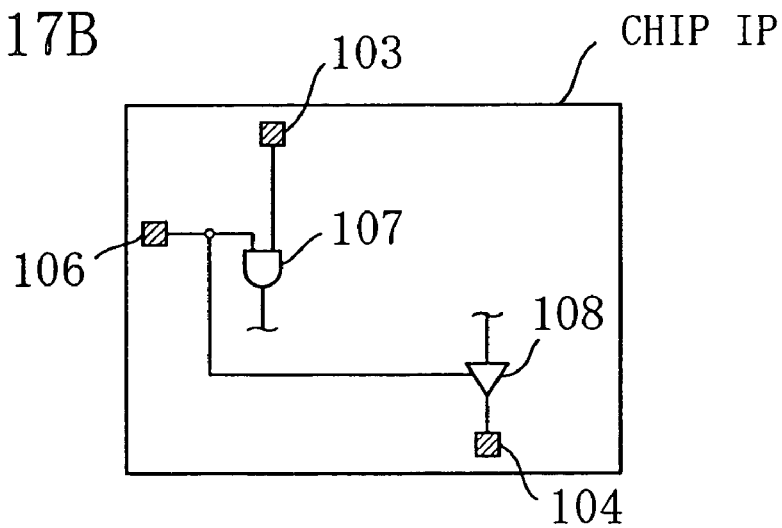
FIG. 17B is a circuit diagram of a characteristic portion of the circuit in one chip IP of the IPOS device in the eighth embodiment.

FIG. 17A is a plan view of the configuration of a portion of an IPOS device in this embodiment, and FIG. 17B is a circuit diagram of a characteristic portion of the circuit in one chip IP of the IPOS device. In the IPOS device of this embodiment, as shown in FIG. 17A, first and second pieces of wiring 101 and 102 for testing only are formed on a silicon wiring substrate so as to extend continuously through the region between each pair of chip IPs and the region where each chip IP exists. The first pieces of testing wiring 101 are signal lines for supplying a scan test pattern to each chip IP (chip IP-A, chip IP-B, ... ) and the second pieces of testing wiring 102 are signal lines for extracting a scan test result signal from each chip IP. Each chip IP is provided with scan-in terminals 103 connected to the first pieces of testing wiring 101, scan-out terminals 104 connected to the second pieces of testing wiring 102, and a clock terminal 105 for receiving a clock signal from common clock wiring.

Referring to FIG. 17B, in each chip IP are provided a test mode input terminal 106 for receiving a test mode signal, and an AND gate 107 which performs AND operation on signals from the test mode input terminal 106 and the scan-in terminal 103. That is, when a mode for making a scan test is selected, data in a test pattern from the scan-in terminal is input to the chip IP by the AND gate 107. In other modes, the AND gate 107 outputs a fixed value (e.g., 0).

A three-state buffer 108 (gate) is provided as a stage before each scan-out terminal 104 in each chip IP. The three-state buffer 108 receives the test mode signal from the test mode terminal 106 as a control signal, outputs a scan test result signal to the scan-out terminal 104 when the mode for making a scan test is selected, and is in a high-impedance state when one of the other modes is selected.

In this embodiment, since data in a test pattern from the scan-in terminal is input to the chip IP by the AND gate 107 when the mode for making a scan test is selected, the piece of wiring for supplying a scan-in signal to each chip IP can be shared between the chip IPs, thus reducing the number of pieces of wiring for testing only. If the piece of wiring for supply of a scan-in signal is shared between the chip IPs, there is a risk of even the chip IPs not subjected to a scan test being operated to increase the power consumption of the entire IPOS device. In this embodiment, however, the AND gate 107 outputs a fixed value to stop the operation of the chip IPs not subjected to a scan test when one of the modes other than the mode for making the scan test is selected, thus reducing the power consumption.

Also, since the three-state buffer 108 (which may be replaced by a different kind of gate device) outputs a scan test result signal to the scan-out terminal 104 when the mode for making a scan test is selected, the piece of wiring for extracting a scan-out signal from each chip IP can be shared between the chip IPs, thus reducing the number of pieces of wiring for testing only. If the piece of wiring for extraction of a scan-out signal is shared between the chip IPs, there is a risk of collision between outputs from a plurality of the chip IPs. In this embodiment, however, the three-state buffer 108 produces a high-impedance output at the scan-out terminal 104 when one of the modes other than the mode for making a scan test is selected, thus reliably preventing mixing of output signals from the chip IPs at the first pieces of wiring 102.

Also, the chip IPs are connected to the common clock wiring to enable the circuits therein to operate in synchronization with each other by a small clock skew.

Embodiment 9

Figure 18:
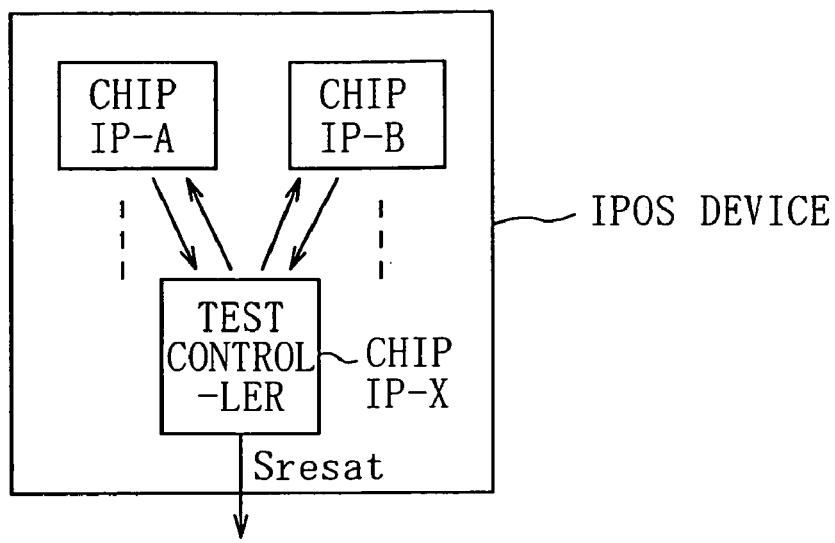
FIG. 18 is a block diagram schematically showing a basic configuration of an IPOS device in a ninth embodiment of the present invention.

A ninth embodiment of the present invention will be described with respect to a chip level test. FIG. 18 is a block diagram schematically showing a basic configuration of an IPOS device in this embodiment. As shown in FIG. 18, the IPOS device of this embodiment has a test controller provided as a chip IP. The test controller instructs each of a chip IP-A, a chip IP-B, . . . on a silicon wiring substrate to start a test. When a test in each chip IP is completed, the test controller receives the test result and outputs information as to which chip IP is defective. Examples of this embodiment will be described.

FIRST EXAMPLE

Figure 19:
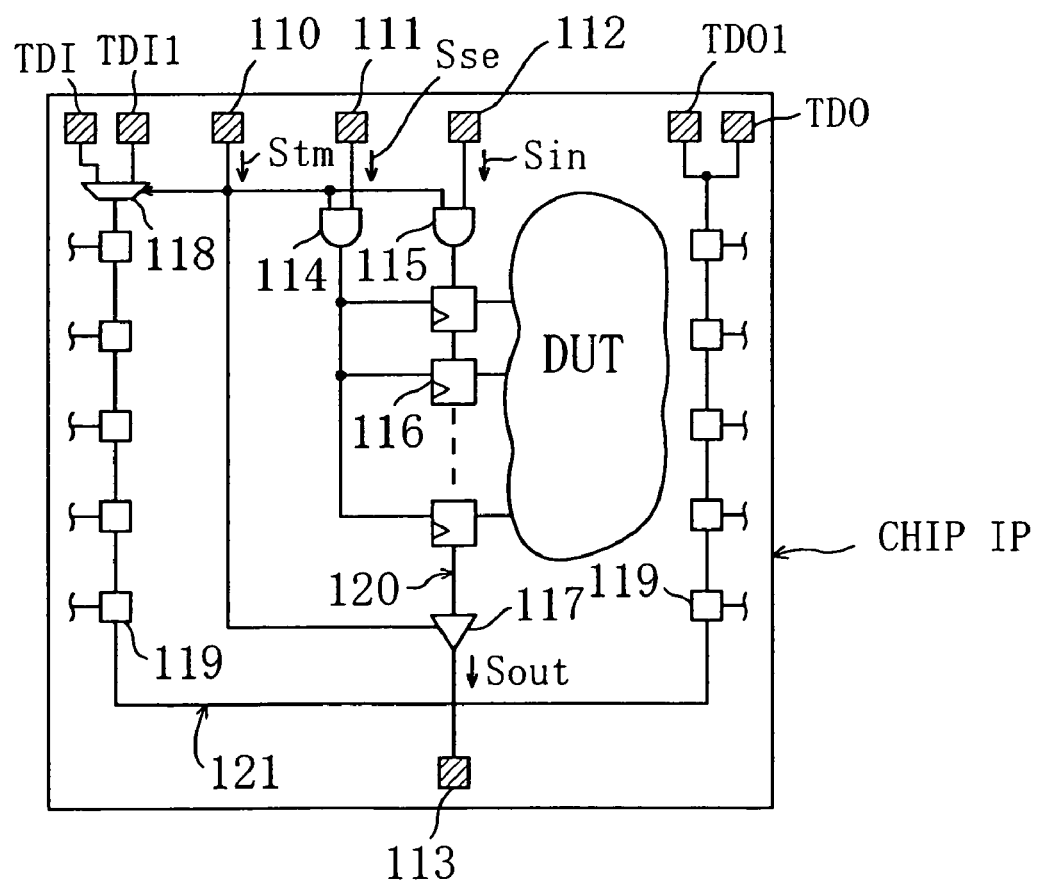
FIG. 19 is a block diagram showing the configuration of a chip IP in a first example of the ninth embodiment.

FIG. 19 is a block diagram showing the configuration of a chip IP in a first example of this embodiment of the present invention.

The chip IP in this example has a control signal input terminal 110 for receiving a scan test mode signal Stm from a test controller, an enable input terminal 111 for receiving a scan enable signal Sse, a scan-in terminal 112 for receiving a scan-in signal Sin, and a scan-out terminal 113 for outputting a scan test result. The chip IP also has a standard input terminal TDI for inputting a boundary scan test signal to the chip IP, a standard output terminal TDO for outputting the boundary scan test signal out of the chip IP, a scan-in terminal TDI1 for inputting a test pattern for an internal test signal, and a scan-out terminal TDO1 for outputting the result of a test using the internal test signal. The chip IP further has an AND circuit 114 which outputs the result of AND operation on the scan test mode signal Stm and the scan enable signal Sse, and an AND circuit 115 which outputs the result of AND operation on the test mode signal Stm and the scan-in signal Sin.

The output from the AND circuit 115 is supplied to flip flops 116 arranged in a scan chain 120 for a scan test, the output being shifted from one flip flop to another, while the output from the AND circuit 114 is transmitted at a time to all the flip flops 116 in the scan chain 120. That is, when the process of separately testing each of the internal circuit (DUT) of the chip IPs in a scanning manner is performed, the scan test mode signal Stm is supplied to one or a plurality of chip IPs. When each chip IP receives the scan test mode signal Stm in the scan enabled state, it immediately takes in the scan-in signal Sin (test pattern) and performs scanning.

A selector 118 is also provided to alternately select signals to be input to a boundary scan test circuit 121 from the standard input terminal TDI and the scan-in terminal TDI1 and to output the selected signal to the boundary scan test circuit 121, as is that in the fourth example of the fifth embodiment. This selector 118 receives the above-mentioned scan test mode signal Stm as a selection control signal. That is, the arrangement in this example is such that a scan test which is based on Enhanced-BST and which can be made simultaneously with internal scanning is carried out and, accordingly, the system is designed so that a scan test and a boundary scan test can be simultaneously performed only by the scan test mode signal Stm.

SECOND EXAMPLE

Figure 20:
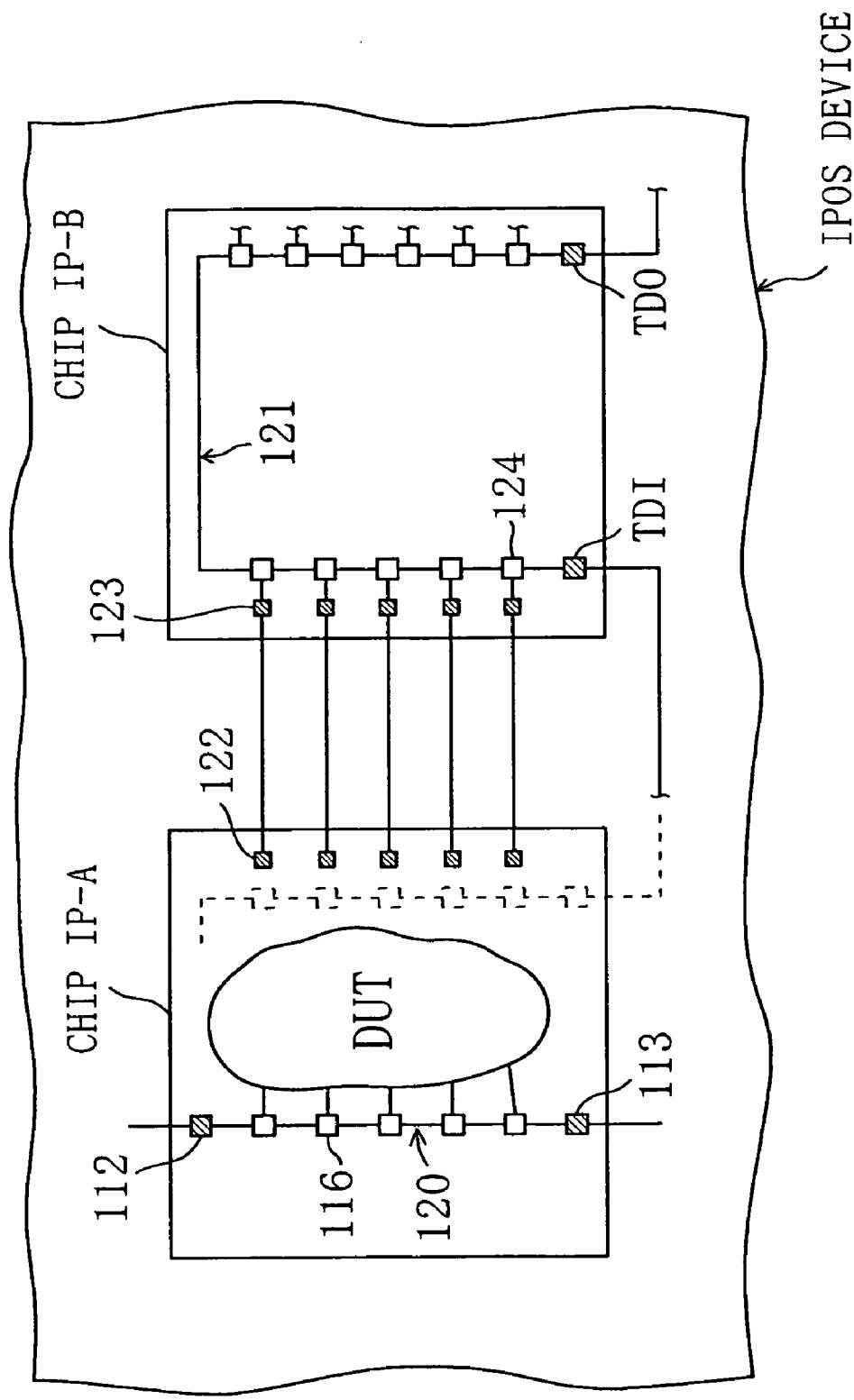
FIG. 20 is a block diagram schematically showing the configuration of a chip IP in a second example of the ninth embodiment.

FIG. 20 is a block diagram schematically showing the configuration of an IPOS device in a second example of this embodiment. In this example, a chip IP-A is provided with a scan chain 120 which is connected between a scan-in terminal 112 and a scan-out terminal 113 via a multiplicity of flip flops 116. The chip IP-A may have a boundary scan test circuit or may have no boundary scan test circuit. An adjacent chip IP-B is provided with a boundary scan test circuit 121 which is connected between a standard input terminal TDI and a standard output terminal TDO via a multiplicity of flip flops 124.

In this example, if the boundary scan test circuit 121 exists in the chip IP-B, the flip flops of the boundary scan test circuit 121 of the chip IP-B are set in a mode for making a boundary scan test when a mode for a scan test on the chip IP-A is selected. The test on the internal circuit (DUT) of the chip IP-A and the test on the connections between the chip IPs are simultaneously performed by using a test pattern input to the scan chain 120 of the chip IP-A and test result data from the boundary scan test circuit 121 of the chip IP-B. If a test result from these tests is NG, a single-chip test may be further made to determine whether a portion of the wiring connections is defective or whether an internal circuit portion of the chip IP is defective.

That is, the arrangement in this embodiment has the advantage of simultaneously making a scan test on the internal circuit of one chip IP and a connection condition test on the wiring between an adjacent pair of chips in one testing cycle.

THIRD EXAMPLE

Figure 21:
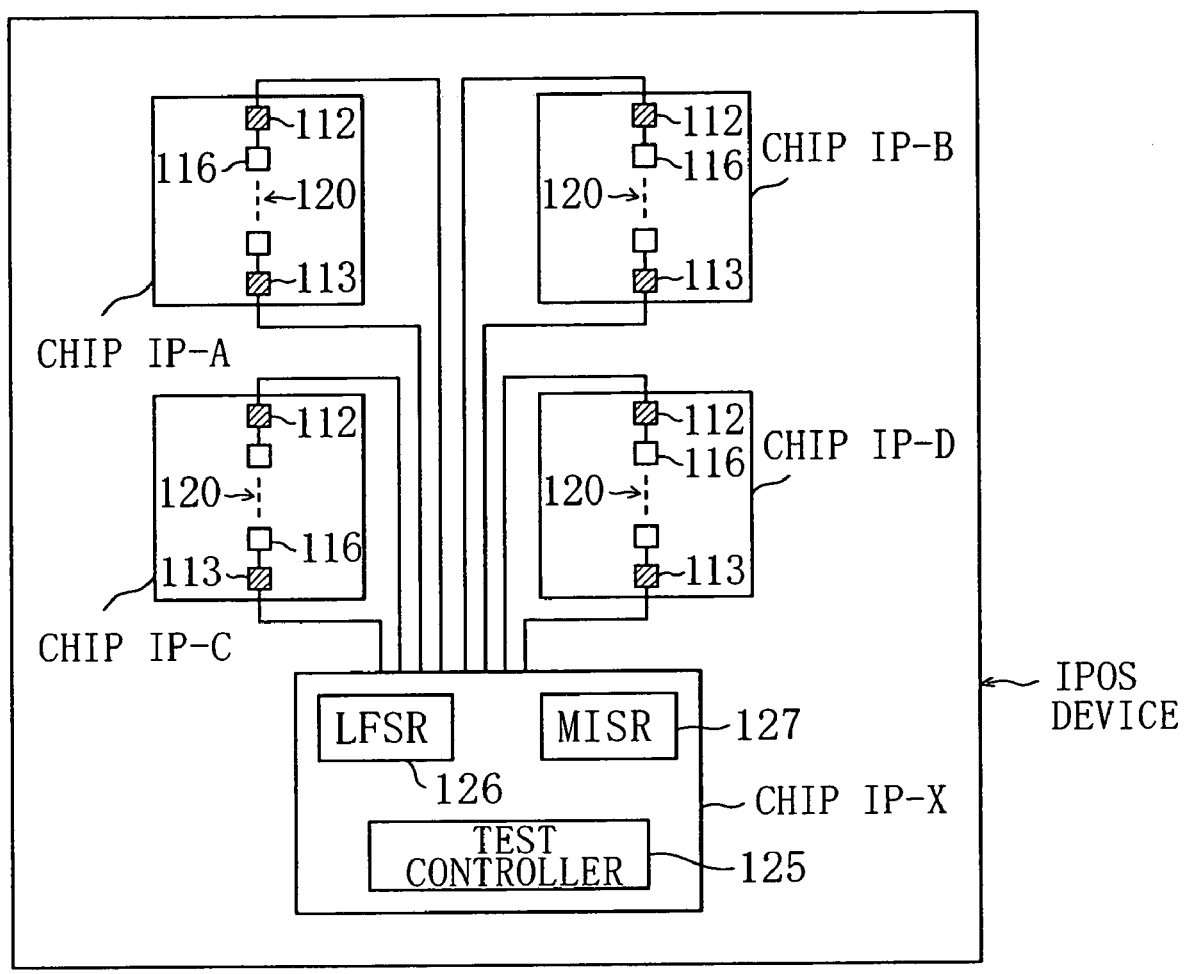
FIG. 21 is a block diagram schematically showing the entire configuration of an IPOS device in a third example of the ninth embodiment.

FIG. 21 is a block diagram schematically showing the entire configuration of an IPOS device in a third example of this embodiment. In the IPOS device in this example, as shown in FIG. 21, a chip IP-X having a test controller 125, a LFSR circuit 126, and a multiple input signature registor (MSR) circuit 127 which is a parallel type of signature analyzer. Also, scan-in terminals 112 and scan-out terminals 113 of a chip IP-A, a chip IP-B, a chip IP-C, a chip IP-D, . . . placed on a silicon wiring substrate are connected in parallel with circuits 125, 126, and 127 in the chip IP-X. That is, the scan chains 120 in the chip IPs are connected in parallel with circuits 125, 126, and 127 in the chip IP-X. Alternatively, the scan chains 120 in the chip IPs may be connected in series with each of the circuits 125, 126, and 127 in the chip IP-X.

When a scan test is made, a test pattern signal is supplied from the LFSR circuit 126 of the chip IP-X to the scan-in terminal 112 of each chip IP and test result data from the scan-out terminal 113 of each chip IP is taken in the MISR circuit 127.

In this embodiment, the functions necessary for a BIST on each chip IP are combined in one chip IP to enable centralized control of the test, thus achieving the effect of reducing the scale of the circuit in each chip IP.

If in the arrangement shown in FIG. 21 the chip IP-X has a power control function and if various tests are made on each chip IP, it is preferable to perform power supply control in such a manner that power is supplied only to the chip IP subjected to tests while no power is supplied to the other chip IPs not subjected to tests. This control makes it possible to avoid a deficiency of power with respect to the power consumption at the time of testing and, hence, to prevent a fault such as a malfunction of the circuit.

Embodiment 10

Figure 22A:
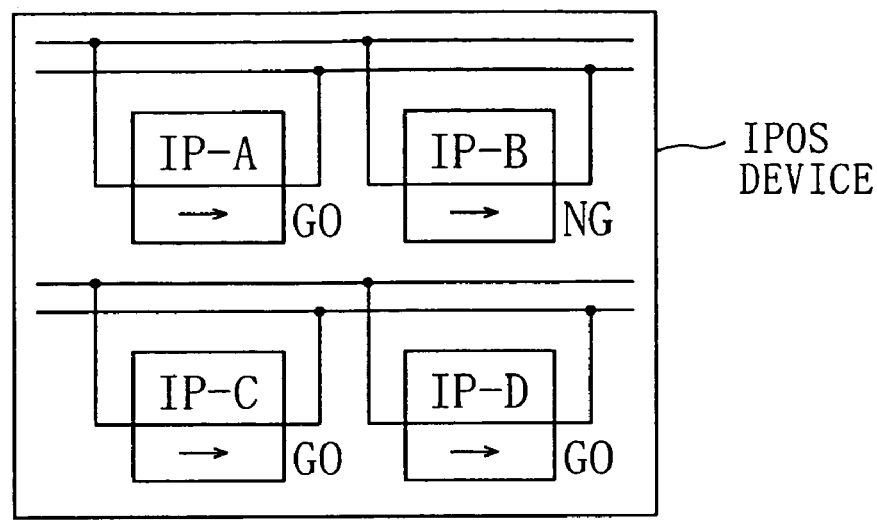
FIGS. 22A and 22B are schematic plan views of the device, showing steps in the IPOS device mounting process in the ninth embodiment.
Figure 22B:
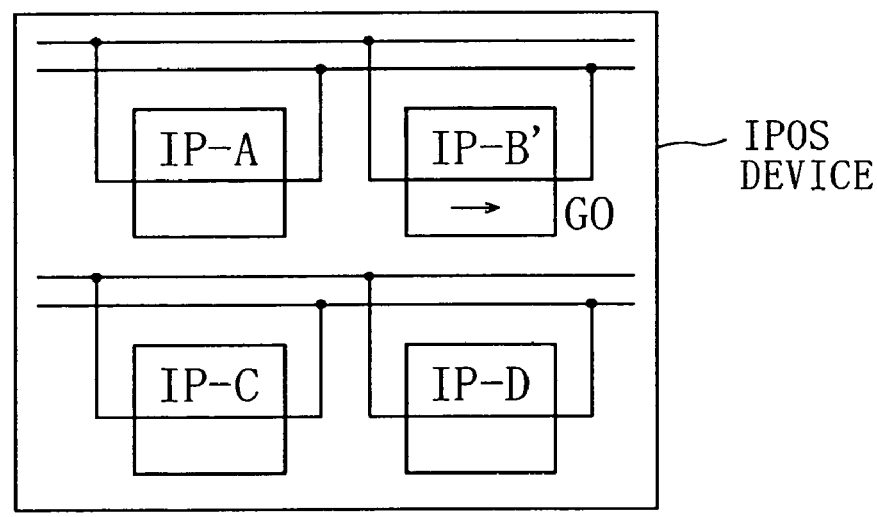

A tenth embodiment of the present invention will be described with respect to a method of mounting components of an IPOS device. FIGS. 22A and 22B are schematic plan views of the device, showing steps in the IPOS device mounting process in this embodiment.

In this embodiment, as shown in FIG. 22A, a scan chain is formed in each of a chip IP-A, a chip IP-B, a chip IP-C, and a chip IP-D. It is assumed here that as a result of a scan test made on each chip IP, the chip IP-A, the chip IP-C and the chip IP-D are nondefective (GO) while the chip IP-B is defective (NG).

Then, the same type of chip IP-B' is mounted on the silicon wiring substrate in place of the chip IP-B, and the scan test is made on the chip IP-B'. Until the chip IP-B' is determined as a nondefective one (GO), the replacement of the chip IPs and the scan test are repeated.

After mounting of conventional system LSIs or three-dimensional devices, replacement on an IP basis is difficult. In contrast, according to this embodiment, in a case where one of a plurality of chip IPs mounted on a silicon wiring substrate is recognized as a defective one as a result of a scan test or the like made on each chip IP in the state where the chip IPs are mounted on the silicon wiring substrate, the defective chip can easily be replaced with a nondefective one. Thus, the facility with which chips are mounted is improved while the desired reliability of IPOS devices is ensured.

What is claimed is:

1. A semiconductor device comprising:
   a semiconductor wiring substrate having a semiconductor substrate and a wiring layer formed on the semiconductor substrate;
   a plurality of chip intellectual properties (IPs) mounted on said semiconductor wiring substrate by being bonded on the semiconductor wiring substrate; and
   a specified chip IP including a test controller provided on said semiconductor wiring substrate for the purpose of controlling a circuit in each of said plurality of chip IPs.

2. The semiconductor device according to claim 1, further comprising:
   an internal scan test circuit provided in a first one of said plurality of chip IPs; and
   a boundary scan test circuit provided in a second one of said plurality of chip IPs;
   wherein said test controller supplies test patterns for said internal scan test circuit and said boundary scan test circuit to test a circuit in said first one of said chip IPs, and connection between said first one and said second one of said chip IPs simultaneously.

3. The semiconductor device according to claim 1, wherein the circuit in each of said chip IPs has a linear feedback shift register (LFSR) function, a multiple input signature register (MISR) function and a BIST function, and
   wherein said test controller supplies a signal from a linear feedback shift register (LFSR) to a scan-in terminal of the circuit in each of said chip IPs and makes a multiple input signature register (MISR) take in a signal from a scan-out terminal of the circuit in each of said chip IPs.

4. The semiconductor device according to claim 1, further comprising a function for controlling the power supply voltage to each of said chip IPs, wherein said test controller supplies the power supply voltage only to the circuit in the chip IP subjected to a test among said plurality of chip IPs and stops supply of power of the power supply voltages to the other chip IPs.

* * * * *

UNITED STATES PATENT AND TRADEMARK OFFICE
CERTIFICATE OF CORRECTION

| | | |
|---|---|---|
| PATENT NO. | : 7,171,600 B2 | Page 1 of 1 |
| APPLICATION NO. | : 10/828263 | |
| DATED | : January 30, 2007 | |
| INVENTOR(S) | : Sadami Takeoka et al. | |

It is certified that error appears in the above-identified patent and that said Letters Patent is hereby corrected as shown below:

On the title page of the Letters Patent,

Under section "(56) References cited, U.S. PATENT DOCUMENTS", change "2002/0194584 A1 12/2002 Tsujii et al. " to --2002/0194564 A1 12/2002 Tsujii et al --

Signed and Sealed this

Twenty-eighth Day of August, 2007

JON W. DUDAS
*Director of the United States Patent and Trademark Office*